US008874050B1

United States Patent
Hietala et al.

(10) Patent No.: US 8,874,050 B1
(45) Date of Patent: Oct. 28, 2014

(54) SATURATION CORRECTION WITHOUT USING SATURATION DETECTION AND SATURATION PREVENTION FOR A POWER AMPLIFIER

(75) Inventors: Alexander Wayne Hietala, Phoenix, AZ (US); Jeffery Peter Ortiz, Chandler, AZ (US); Timothy Keith Coffman, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 412 days.

(21) Appl. No.: 12/774,155

(22) Filed: May 5, 2010

Related U.S. Application Data

(60) Provisional application No. 61/175,641, filed on May 5, 2009, provisional application No. 61/249,170, filed on Oct. 6, 2009.

(51) Int. Cl.
H01Q 11/12 (2006.01)

(52) U.S. Cl.
USPC ............ 455/127.1; 455/115.1; 455/126; 455/114.3; 375/219; 375/320; 375/297; 330/129; 330/281; 330/279

(58) Field of Classification Search
USPC ............ 455/296, 127.1, 127.2, 114.1–115.3, 455/115.1, 126, 114.3; 375/219, 320, 296, 375/297; 330/129, 278–282, 254, 256, 260
See application file for complete search history.

(56) References Cited

U.S. PATENT DOCUMENTS

| | | | |
|---|---|---|---|
| 3,735,289 A | 5/1973 | Bruene | |
| 4,523,155 A | 6/1985 | Walczak et al. | |
| 4,638,255 A | 1/1987 | Penney | |
| 5,212,459 A | 5/1993 | Ueda et al. | |
| 5,278,994 A | 1/1994 | Black et al. | |
| 5,307,512 A | 4/1994 | Mitzlaff | |
| 5,343,307 A | 8/1994 | Mizuno et al. | |
| 5,404,547 A | 4/1995 | Diamantstein et al. | |
| 5,432,473 A | 7/1995 | Mattila et al. | |
| 5,603,106 A | 2/1997 | Toda | |
| 5,642,075 A * | 6/1997 | Bell ............................ 330/129 |
| 5,652,547 A | 7/1997 | Mokhtar et al. | |

(Continued)

FOREIGN PATENT DOCUMENTS

GB 2444984 A 6/2008

OTHER PUBLICATIONS

Notice of Allowance for U.S. Appl. No. 12/773,292 mailed Feb. 22, 2012, 12 pages.

(Continued)

Primary Examiner — Junpeng Chen
(74) Attorney, Agent, or Firm — Withrow & Terranova, P.L.L.C.

(57) ABSTRACT

A circuit and method for a saturation correction of a power amplifier (PA) is provided in order to maintain a desirable switching spectrum. The circuit includes a closed loop system that is responsive to a dynamic PA control signal known as $V_{RAMP}$. The method samples a detector voltage that represents the output of the PA at the maximum voltage level of $V_{RAMP}$. The sampled detector voltage is then reduced by a predetermined amount and applied as a fixed voltage PA control signal in the place of $V_{RAMP}$. As a result, the closed loop system responds to the fixed voltage PA control signal to bring the PA out of saturation before $V_{RAMP}$ can begin a voltage decrease. Once the $V_{RAMP}$ voltage decreases, $V_{RAMP}$ is reapplied as a dynamic PA control signal in place of the fixed voltage control signal.

20 Claims, 13 Drawing Sheets

(56) References Cited

U.S. PATENT DOCUMENTS

| | | | |
|---|---|---|---|
| 5,724,004 A | 3/1998 | Reif et al. | |
| 5,832,373 A | 11/1998 | Nakanishi et al. | |
| 5,841,319 A * | 11/1998 | Sato | 330/129 |
| 5,852,632 A | 12/1998 | Capici et al. | |
| 5,860,080 A | 1/1999 | James et al. | |
| 5,872,481 A | 2/1999 | Sevic et al. | |
| 5,874,841 A | 2/1999 | Majid et al. | |
| 5,920,808 A | 7/1999 | Jones et al. | |
| 5,923,761 A | 7/1999 | Lodenius | |
| 5,956,246 A | 9/1999 | Sequeira et al. | |
| 6,064,272 A | 5/2000 | Rhee | |
| 6,194,968 B1 | 2/2001 | Winslow | |
| 6,229,366 B1 | 5/2001 | Balakirshnan et al. | |
| 6,259,901 B1 | 7/2001 | Shinomiya et al. | |
| 6,425,107 B1 | 7/2002 | Caldara et al. | |
| 6,559,492 B1 | 5/2003 | Hazucha et al. | |
| 6,606,483 B1 | 8/2003 | Baker et al. | |
| 6,670,849 B1 | 12/2003 | Damgaard et al. | |
| 6,674,789 B1 | 1/2004 | Fardoun et al. | |
| 6,724,252 B2 | 4/2004 | Ngo et al. | |
| 6,774,508 B2 | 8/2004 | Ballantyne et al. | |
| 6,806,768 B2 | 10/2004 | Klaren et al. | |
| 6,853,244 B2 | 2/2005 | Robinson et al. | |
| 6,888,482 B1 | 5/2005 | Hertle | |
| 6,900,697 B1 | 5/2005 | Doyle et al. | |
| 6,906,590 B2 | 6/2005 | Amano | |
| 6,917,188 B2 | 7/2005 | Kernahan | |
| 6,937,487 B1 | 8/2005 | Bron | |
| 6,954,623 B2 | 10/2005 | Chang et al. | |
| 6,969,978 B2 | 11/2005 | Dening | |
| 6,998,914 B2 | 2/2006 | Robinson | |
| 7,035,069 B2 | 4/2006 | Takikawa et al. | |
| 7,043,213 B2 | 5/2006 | Robinson et al. | |
| 7,058,374 B2 | 6/2006 | Levesque et al. | |
| 7,072,626 B2 | 7/2006 | Hadjichristos | |
| 7,075,346 B1 | 7/2006 | Hariman et al. | |
| 7,098,728 B1 | 8/2006 | Mei et al. | |
| 7,116,949 B2 | 10/2006 | Irie et al. | |
| 7,145,385 B2 | 12/2006 | Brandt et al. | |
| 7,148,749 B2 * | 12/2006 | Rahman et al. | 330/279 |
| 7,154,336 B2 | 12/2006 | Maeda | |
| 7,177,607 B2 * | 2/2007 | Weiss | 455/127.1 |
| 7,184,731 B2 | 2/2007 | Kim | |
| 7,187,910 B2 | 3/2007 | Kim et al. | |
| 7,202,734 B1 | 4/2007 | Raab | |
| 7,248,111 B1 | 7/2007 | Xu et al. | |
| 7,263,337 B2 | 8/2007 | Struble | |
| 7,298,600 B2 | 11/2007 | Takikawa et al. | |
| 7,299,015 B2 | 11/2007 | Iwamiya et al. | |
| 7,324,787 B2 | 1/2008 | Kurakami et al. | |
| 7,333,564 B2 | 2/2008 | Sugiyama et al. | |
| 7,333,778 B2 | 2/2008 | Pehlke et al. | |
| 7,342,455 B2 | 3/2008 | Behzad et al. | |
| 7,358,807 B2 | 4/2008 | Scuderi et al. | |
| 7,368,985 B2 | 5/2008 | Kusunoki | |
| 7,372,333 B2 | 5/2008 | Abedinpour et al. | |
| 7,408,330 B2 | 8/2008 | Zhao | |
| 7,477,106 B2 | 1/2009 | Van Bezooijen et al. | |
| 7,483,678 B2 | 1/2009 | Rozenblit et al. | |
| 7,518,448 B1 | 4/2009 | Blair et al. | |
| 7,529,523 B1 | 5/2009 | Young et al. | |
| 7,539,462 B2 | 5/2009 | Peckham et al. | |
| 7,551,688 B2 | 6/2009 | Matero et al. | |
| 7,554,407 B2 | 6/2009 | Hau et al. | |
| 7,558,539 B2 | 7/2009 | Huynh et al. | |
| 7,580,443 B2 | 8/2009 | Uemura et al. | |
| 7,622,900 B2 | 11/2009 | Komiya | |
| 7,664,520 B2 | 2/2010 | Gu | |
| 7,667,987 B2 | 2/2010 | Huynh et al. | |
| 7,684,220 B2 | 3/2010 | Fang et al. | |
| 7,689,182 B1 | 3/2010 | Bosley et al. | |
| 7,701,290 B2 | 4/2010 | Liu | |
| 7,702,300 B1 | 4/2010 | McCune | |
| 7,714,546 B2 | 5/2010 | Kimura et al. | |
| 7,724,097 B2 | 5/2010 | Carley et al. | |
| 7,768,354 B2 | 8/2010 | Matsuda et al. | |
| 7,782,141 B2 | 8/2010 | Witmer et al. | |
| 7,783,272 B2 | 8/2010 | Magnusen | |
| 7,787,570 B2 * | 8/2010 | Rozenblit et al. | 375/320 |
| 7,796,410 B2 | 9/2010 | Takayanagi et al. | |
| 7,859,511 B2 | 12/2010 | Shen et al. | |
| 7,860,466 B2 | 12/2010 | Woo et al. | |
| 7,876,159 B2 | 1/2011 | Wang et al. | |
| 7,907,430 B2 | 3/2011 | Kularatna et al. | |
| 7,941,110 B2 | 5/2011 | Gonzalez | |
| 7,999,484 B2 | 8/2011 | Jurngwirth et al. | |
| 8,000,117 B2 | 8/2011 | Petricek | |
| 8,031,003 B2 | 10/2011 | Dishop | |
| 8,085,106 B2 | 12/2011 | Huda et al. | |
| 8,089,323 B2 | 1/2012 | Tarng et al. | |
| 8,098,093 B1 | 1/2012 | Li | |
| 8,131,234 B2 | 3/2012 | Liang et al. | |
| 8,134,410 B1 | 3/2012 | Zortea | |
| 8,149,050 B2 | 4/2012 | Cabanillas | |
| 8,149,061 B2 | 4/2012 | Schuurmans | |
| 8,213,888 B2 * | 7/2012 | Kuriyama et al. | 455/127.2 |
| 8,228,122 B1 | 7/2012 | Yuen et al. | |
| 8,258,875 B1 | 9/2012 | Smith et al. | |
| 8,461,921 B2 | 6/2013 | Pletcher et al. | |
| 8,514,025 B2 | 8/2013 | Lesso | |
| 2002/0055376 A1 | 5/2002 | Norimatsu | |
| 2002/0055378 A1 | 5/2002 | Imel et al. | |
| 2003/0006845 A1 | 1/2003 | Lopez et al. | |
| 2003/0042885 A1 | 3/2003 | Zhou et al. | |
| 2003/0073418 A1 | 4/2003 | Dening et al. | |
| 2003/0087626 A1 | 5/2003 | Prikhodko et al. | |
| 2003/0201674 A1 | 10/2003 | Droppo et al. | |
| 2003/0201834 A1 | 10/2003 | Pehlke | |
| 2003/0227280 A1 | 12/2003 | Vinciarelli | |
| 2004/0068673 A1 | 4/2004 | Espinoza-Ibarra et al. | |
| 2004/0095118 A1 | 5/2004 | Kernahan | |
| 2004/0127173 A1 | 7/2004 | Leizerovich | |
| 2004/0183507 A1 | 9/2004 | Amei | |
| 2004/0185805 A1 | 9/2004 | Kim et al. | |
| 2004/0192369 A1 | 9/2004 | Nilsson | |
| 2004/0222848 A1 | 11/2004 | Shih et al. | |
| 2004/0235438 A1 | 11/2004 | Quilisch et al. | |
| 2005/0017787 A1 | 1/2005 | Kojima | |
| 2005/0046507 A1 | 3/2005 | Dent | |
| 2005/0064830 A1 | 3/2005 | Grigore | |
| 2005/0088237 A1 | 4/2005 | Gamero et al. | |
| 2005/0110559 A1 | 5/2005 | Farkas et al. | |
| 2005/0134388 A1 | 6/2005 | Jenkins | |
| 2005/0136854 A1 | 6/2005 | Akizuki et al. | |
| 2005/0136866 A1 | 6/2005 | Dupuis | |
| 2005/0168281 A1 | 8/2005 | Nagamori et al. | |
| 2005/0200407 A1 | 9/2005 | Arai et al. | |
| 2005/0227644 A1 | 10/2005 | Maslennikov et al. | |
| 2005/0245214 A1 | 11/2005 | Nakamura et al. | |
| 2005/0280471 A1 | 12/2005 | Matsushita et al. | |
| 2005/0288052 A1 | 12/2005 | Carter et al. | |
| 2005/0289375 A1 | 12/2005 | Ranganathan et al. | |
| 2006/0006943 A1 | 1/2006 | Clifton et al. | |
| 2006/0017426 A1 | 1/2006 | Yang et al. | |
| 2006/0038710 A1 | 2/2006 | Staszewski et al. | |
| 2006/0046666 A1 | 3/2006 | Hara et al. | |
| 2006/0046668 A1 | 3/2006 | Uratani et al. | |
| 2006/0052065 A1 | 3/2006 | Argaman et al. | |
| 2006/0067425 A1 | 3/2006 | Windisch | |
| 2006/0067426 A1 | 3/2006 | Maltsev et al. | |
| 2006/0084398 A1 | 4/2006 | Chmiel et al. | |
| 2006/0119331 A1 | 6/2006 | Jacobs et al. | |
| 2006/0146956 A1 | 7/2006 | Kim et al. | |
| 2006/0221646 A1 | 10/2006 | Ye et al. | |
| 2006/0226909 A1 | 10/2006 | Abedinpour et al. | |
| 2006/0290444 A1 | 12/2006 | Chen | |
| 2006/0293005 A1 | 12/2006 | Hara et al. | |
| 2007/0024360 A1 | 2/2007 | Markowski | |
| 2007/0026824 A1 | 2/2007 | Ono et al. | |
| 2007/0032201 A1 | 2/2007 | Behzad et al. | |
| 2007/0069820 A1 | 3/2007 | Hayata et al. | |
| 2007/0096806 A1 | 5/2007 | Sorrells et al. | |
| 2007/0096810 A1 | 5/2007 | Hageman et al. | |
| 2007/0129025 A1 | 6/2007 | Vasa et al. | |

(56) References Cited

U.S. PATENT DOCUMENTS

| | | |
|---|---|---|
| 2007/0146090 A1 | 6/2007 | Carey et al. |
| 2007/0182490 A1 | 8/2007 | Hau et al. |
| 2007/0210776 A1 | 9/2007 | Oka |
| 2007/0222520 A1 | 9/2007 | Inamori et al. |
| 2007/0249300 A1 | 10/2007 | Sorrells et al. |
| 2007/0249304 A1 | 10/2007 | Snelgrove et al. |
| 2007/0281635 A1 | 12/2007 | McCallister et al. |
| 2007/0291873 A1 | 12/2007 | Saito et al. |
| 2008/0003950 A1 | 1/2008 | Haapoja et al. |
| 2008/0008273 A1 | 1/2008 | Kim et al. |
| 2008/0009248 A1 | 1/2008 | Rozenblit et al. |
| 2008/0023825 A1 | 1/2008 | Hebert et al. |
| 2008/0036532 A1 | 2/2008 | Pan |
| 2008/0051044 A1 | 2/2008 | Takehara |
| 2008/0057883 A1 | 3/2008 | Pan |
| 2008/0081572 A1 | 4/2008 | Rofougaran |
| 2008/0136559 A1 | 6/2008 | Takahashi et al. |
| 2008/0157732 A1 | 7/2008 | Williams |
| 2008/0205547 A1 | 8/2008 | Rofougaran |
| 2008/0233913 A1 | 9/2008 | Sivasubramaniam |
| 2008/0278136 A1 | 11/2008 | Murtojarvi |
| 2008/0278236 A1 | 11/2008 | Seymour |
| 2009/0004981 A1 | 1/2009 | Eliezer et al. |
| 2009/0011787 A1 | 1/2009 | Kikuma |
| 2009/0021302 A1 | 1/2009 | Elia |
| 2009/0059630 A1 | 3/2009 | Williams |
| 2009/0068966 A1 | 3/2009 | Drogi et al. |
| 2009/0104900 A1 | 4/2009 | Lee |
| 2009/0115520 A1 | 5/2009 | Ripley et al. |
| 2009/0153250 A1 | 6/2009 | Rofougaran |
| 2009/0163157 A1 | 6/2009 | Zolfaghari |
| 2009/0176464 A1 | 7/2009 | Liang et al. |
| 2009/0191826 A1 | 7/2009 | Takinami et al. |
| 2009/0258611 A1 | 10/2009 | Nakamura et al. |
| 2009/0264091 A1* | 10/2009 | Jensen et al. ............... 455/296 |
| 2009/0274207 A1 | 11/2009 | O'Keeffe et al. |
| 2009/0285331 A1 | 11/2009 | Sugar et al. |
| 2009/0289719 A1 | 11/2009 | Van Bezooijen et al. |
| 2009/0311980 A1 | 12/2009 | Sjoland |
| 2009/0322304 A1 | 12/2009 | Oraw et al. |
| 2010/0007412 A1 | 1/2010 | Wang et al. |
| 2010/0007414 A1 | 1/2010 | Searle et al. |
| 2010/0007433 A1 | 1/2010 | Jensen |
| 2010/0013548 A1 | 1/2010 | Barrow |
| 2010/0020899 A1 | 1/2010 | Szopko et al. |
| 2010/0027596 A1* | 2/2010 | Bellaouar et al. ............ 375/219 |
| 2010/0029224 A1 | 2/2010 | Urushihara et al. |
| 2010/0097104 A1 | 4/2010 | Yang et al. |
| 2010/0102789 A1 | 4/2010 | Randall |
| 2010/0109561 A1 | 5/2010 | Chen et al. |
| 2010/0120384 A1 | 5/2010 | Pennec |
| 2010/0120475 A1 | 5/2010 | Taniuchi et al. |
| 2010/0123447 A1 | 5/2010 | Vecera et al. |
| 2010/0127781 A1 | 5/2010 | Inamori et al. |
| 2010/0128689 A1 | 5/2010 | Yoon et al. |
| 2010/0164579 A1 | 7/2010 | Acatrinei |
| 2010/0176869 A1 | 7/2010 | Horie et al. |
| 2010/0181980 A1 | 7/2010 | Richardson |
| 2010/0189042 A1 | 7/2010 | Pan |
| 2010/0222015 A1 | 9/2010 | Shimizu et al. |
| 2010/0233977 A1 | 9/2010 | Minnis et al. |
| 2010/0237944 A1 | 9/2010 | Pierdomenico et al. |
| 2010/0291888 A1 | 11/2010 | Hadjichristos et al. |
| 2010/0295599 A1 | 11/2010 | Uehara et al. |
| 2010/0311362 A1 | 12/2010 | Lee et al. |
| 2011/0018516 A1 | 1/2011 | Notman et al. |
| 2011/0018632 A1 | 1/2011 | Pletcher et al. |
| 2011/0018640 A1 | 1/2011 | Liang et al. |
| 2011/0032030 A1 | 2/2011 | Ripley et al. |
| 2011/0051842 A1 | 3/2011 | van der Heijden et al. |
| 2011/0068768 A1 | 3/2011 | Chen et al. |
| 2011/0068873 A1 | 3/2011 | Alidio et al. |
| 2011/0075772 A1 | 3/2011 | Sethi et al. |
| 2011/0080205 A1 | 4/2011 | Lee |
| 2011/0095735 A1 | 4/2011 | Lin |
| 2011/0123048 A1 | 5/2011 | Wang et al. |
| 2011/0136452 A1 | 6/2011 | Pratt et al. |
| 2011/0181115 A1 | 7/2011 | Ivanov |
| 2011/0298538 A1 | 12/2011 | Andrys et al. |
| 2011/0309884 A1 | 12/2011 | Dishop |
| 2012/0044022 A1 | 2/2012 | Walker et al. |
| 2012/0064953 A1 | 3/2012 | Dagher et al. |
| 2012/0223773 A1 | 9/2012 | Jones et al. |
| 2012/0229210 A1 | 9/2012 | Jones et al. |
| 2012/0235736 A1 | 9/2012 | Levesque et al. |
| 2012/0236958 A1 | 9/2012 | Deng et al. |
| 2012/0242413 A1 | 9/2012 | Lesso |
| 2012/0252382 A1 | 10/2012 | Bashir et al. |
| 2013/0005286 A1 | 1/2013 | Chan et al. |
| 2013/0307616 A1 | 11/2013 | Berchtold et al. |
| 2013/0342270 A1 | 12/2013 | Baxter et al. |
| 2013/0344828 A1 | 12/2013 | Baxter et al. |
| 2013/0344833 A1 | 12/2013 | Baxter et al. |

OTHER PUBLICATIONS

Unknown Author, "SKY77344-21 Power Amplifier Module—Evaluation Information," Skyworks, Version-21 Feb. 16, 2010, 21 pages.

Notice of Allowance for U.S. Appl. No. 12/773,292 mailed Jul. 16, 2012, 12 pages.

Author Unknown, "60mA, 5.0V, Buck/Boost Charge Pump in ThinSOT-23 and ThinQFN", Texas Instruments Incorporated, REG710, SBAS221 F, Dec. 2001, revised Mar. 2008, 23 pages.

Author Unknown, "DC-to-DC Converter Combats EMI," Maxim Integrated Products, Application Note 1077, May 28, 2002, 4 pages, http://www.maxim-ic.com/an1077/.

Author Unknown, "MIPI Alliance Specification for RF Front-End Control Interface", Mobile Industry Processor Interface (MIPI) Alliance, Version 1.00.00, May 3, 2010, approved Jul. 16, 2010, 88 pages.

Author Unknown, "SKY77344-21 Power Amplifier Module—Evaluation Information," Skyworks Solutions, Inc., Version-21, Feb. 16, 2010, 21 pages.

Bastida, E.M. et al., "Cascadable Monolithic Balanced Amplifiers at Microwave Frequencies," 10th European Microwave Conference, Sep. 8-12, 1980, pp. 603-607.

Berretta, G. et al., "A Balanced CDMA2000 SiGe HBT Load Insensitive Power Amplifier," 2006 IEEE Radio and Wireless Symposium, Jan. 17-19, 2006, pp. 523-526.

Grebennikov, A. et al., "High-Efficiency Balanced Switched-Path Monolithic SiGe HBT Power Amplifiers for Wireless Applications," Proceedings of the 2nd European Microwave Integrated Circuits Conference, Oct. 8-10, 2007, pp. 391-394.

Grebennikov, A., "Circuit Design Technique for High Efficiency Class F Amplifiers," 2000 IEEE International Microwave Symposium Digest, vol. 2, Jun. 11-16, 2000, pp. 771-774.

Kurokawa, K., "Design Theory of Balanced Transistor Amplifiers," Bell System Technical Journal, vol. 44, Oct. 1965, pp. 1675-1698, Bell Labs.

Li, Y. et al., "LTE Power Amplifier Module Design: Challenges and Trends," IEEE International Conference on Solid-State and Integrated Circuit Technology, Nov. 2010, pp. 192-195.

Mandeep, J.S. et al., "A Compact, Balanced Low Noise Amplifier for WiMAX Base Station Applications", Microwave Journal, vol. 53, No. 11, Nov. 2010, p. 84-92.

Noriega, Fernando et al., "Designing LC Wilkinson power splitters," RF interconnects/interfaces, Aug. 2002, pp. 18-24, www.rfdesign.com.

Pampichai, Samphan et al., "A 3-dB Lumped-Distributed Miniaturized Wilkinson Divider," Electrical Engineering Conference (EECON-23), Nov. 2000, pp. 329-332.

Podcameni, A.B. et al., "An Amplifier Linearization Method Based on a Quadrature Balanced Structure," IEEE Transactions on Broadcasting, vol. 48, No. 2, Jun. 2002, p. 158-162.

Scuderi, A. et al., "Balanced SiGe PA Module for Multi-Band and Multi-Mode Cellular-Phone Applications," Digest of Technical Papers, 2008 IEEE International Solid-State Circuits Conference, Feb. 3-7, 2008, pp. 572-573, 637.

(56) References Cited

OTHER PUBLICATIONS

Wang, P. et al., "A 2.4-GHz +25dBm P-1dB Linear Power Amplifier with Dynamic Bias Control in a 65-nm CMOS Process," 2008 European Solid-State Circuits Conference, Sep. 15-19, 2008, pp. 490-493.

Zhang, G. et al., "A High Performance Balanced Power Amplifier and Its Integration into a Front-end Module at PCS Band," 2007 IEEE Radio Frequency Integrated Circuits Symposium, Jun. 3-5, 2007, p. 251-254.

Zhang, G. et al., "Dual Mode Efficiency Enhanced Linear Power Amplifiers Using a New Balanced Structure," 2009 IEEE Radio Frequency Integrated Circuits Symposium, Jun. 7-9, 2009, pp. 245-248.

Non-Final Office Action for U.S. Appl. No. 11/756,909, mailed May 15, 2009, 11 pages.

Final Office Action for U.S. Appl. No. 11/756,909, mailed Nov. 18, 2009, 14 pages.

Notice of Allowance for U.S. Appl. No. 11/756,909, mailed Dec. 23, 2010, 7 pages.

Non-Final Office Action for U.S. Appl. No. 12/433,377, mailed Jun. 16, 2011, 7 pages.

Notice of Allowance for U.S. Appl. No. 12/433,377, mailed Oct. 31, 2011, 8 pages.

Non-Final Office Action for U.S. Appl. No. 12/567,318, mailed May 29, 2012, 7 pages.

Final Office Action for U.S. Appl. No. 12/567,318, mailed Oct. 22, 2012, 7 pages.

Non-Final Office Action for U.S. Appl. No. 12/567,318, mailed Apr. 2, 2013, 5 pages.

Final Office Action for U.S. Appl. No. 12/567,318, mailed Jul. 19, 2013, 7 pages.

Advisory Action for U.S. Appl. No. 12/567,318, mailed Aug. 27, 2013, 3 pages.

Non-Final Office Action for U.S. Appl. No. 12/567,318, mailed Oct. 24, 2013, 6 pages.

Non-Final Office Action for U.S. Appl. No. 12/723,738, mailed Dec. 20, 2012, 7 pages.

Non-Final Office Action for U.S. Appl. No. 12/749,091, mailed Mar. 25, 2013, 9 pages.

Notice of Allowance for U.S. Appl. No. 12/749,091, mailed May 20, 2013, 9 pages.

Quayle Action for U.S. Appl. No. 13/198,074, mailed Jan. 22, 2013, 5 pages.

Notice of Allowance for U.S. Appl. No. 13/198,074, mailed Apr. 12, 2013, 8 pages.

Notice of Allowance for U.S. Appl. No. 13/090,663, mailed Nov. 28, 2012, 8 pages.

Non-Final Office Action for U.S. Appl. No. 13/019,777, mailed Feb. 19, 2013, 9 pages.

Notice of Allowance for U.S. Appl. No. 13/019,077, mailed May 24, 2013, 9 pages.

Invitation to Pay Additional Fees and, Where Applicable, Protest Fee for PCT/US2011/050633, mailed Aug. 22, 2012, 5 pages.

International Search Report and Written Opinion for PCT/US2011/050633, mailed Mar. 8, 2013, 23 pages.

International Preliminary Report on Patentability for PCT/US2011/050633, mailed Mar. 28, 2013, 17 pages.

Non-Final Office Action for U.S. Appl. No. 13/289,134, mailed Feb. 6, 2013, 13 pages.

Notice of Allowance for U.S. Appl. No. 13/289,134, mailed Jun. 6, 2013, 8 pages.

Non-Final Office Action for U.S. Appl. No. 13/287,726, mailed Jan. 25, 2013, 11 pages.

Non-Final Office Action for U.S. Appl. No. 13/287,726, mailed May 16, 2013, 9 pages.

Notice of Allowance for U.S. Appl. No. 13/287,726, mailed Oct. 7, 2013, 9 pages.

Non-Final Office Action for U.S. Appl. No. 13/287,713, mailed Aug. 5, 2013, 7 pages.

Non-Final Office Action for U.S. Appl. No. 13/287,735, mailed Jan. 25, 2013, 11 pages.

Notice of Allowance for U.S. Appl. No. 13/287,735, mailed May 28, 2013, 8 pages.

Non-Final Office Action for U.S. Appl. No. 13/288,318, mailed Feb. 5, 2013, 12 pages.

Non-Final Office Action for U.S. Appl. No. 13/288,318, mailed Jun. 3, 2013, 14 pages.

Final Office Action for U.S. Appl. No. 13/287,713, mailed Dec. 6, 2013, 9 pages.

Notice of Allowance for U.S. Appl. No. 13/288,478, mailed Nov. 18, 2013, 9 pages.

Non-Final Office Action for U.S. Appl. No. 13/288,517, mailed Oct. 31, 2013, 10 pages.

Non-Final Office Action for U.S. Appl. No. 13/288,373, mailed Nov. 19, 2013, 5 pages.

Non-Final Office Action for U.S. Appl. No. 13/288,590, mailed Dec. 5, 2013, 8 pages.

Notice of Allowance for U.S. Appl. No. 13/304,735, mailed Jan. 2, 2014, 8 pages.

Notice of Allowance for U.S. Appl. No. 13/304,796, mailed Dec. 5, 2013, 9 pages.

Notice of Allowance for U.S. Appl. No. 13/304,943, mailed Dec. 5, 2013, 9 pages.

Advisory Action for U.S. Appl. No. 13/226,814, mailed Dec. 31, 2013, 3 pages.

Final Office Action for U.S. Appl. No. 13/479,816, mailed Nov. 1, 2013, 15 pages.

Advisory Action for U.S. Appl. No. 13/479,816, mailed Jan. 7, 2014, 3 pages.

Non-Final Office Action for U.S. Appl. No. 13/656,997, mailed Jan. 13, 2014, 6 pages.

Notice of Allowance for U.S. Appl. No. 12/567,318, mailed Feb. 18, 2014, 8 pages.

Non-Final Office Action for U.S. Appl. No. 12/723,738, mailed Apr. 28, 2014, 14 pages.

Advisory Action for U.S. Appl. No. 13/287,713, mailed Feb. 20, 2014, 4 pages.

Non-Final Office Action for U.S. Appl. No. 13/288,517, mailed Apr. 28, 2014, 10 pages.

Non-Final Office Action for U.S. Appl. No. 13/226,843, mailed Mar. 31, 2014, 7 pages.

Notice of Allowance for U.S. Appl. No. 13/288,273, mailed Apr. 25, 2014, 7 pages.

Notice of Allowance for U.S. Appl. No. 13/288,373, mailed May 7, 2014, 7 pages.

Non-Final Office Action for U.S. Appl. No. 13/288,590, mailed May 8, 2014, 11 pages.

Notice of Allowance for U.S. Appl. No. 13/304,762, mailed Apr. 16, 2014, 7 pages.

Final Office Action for U.S. Appl. No. 13/226,777, mailed Mar. 21, 2014, 13 pages.

Non-Final Office Action for U.S. Appl. No. 13/656,997, mailed Apr. 30, 2014, 8 pages.

Notice of Allowance for U.S. Appl. No. 13/288,318, mailed Oct. 24, 2013, 9 pages.

Non-Final Office Action for U.S. Appl. No. 13/288,478, mailed Dec. 26, 2012, 8 pages.

Non-Final Office Action for U.S. Appl. No. 13/288,478, mailed Jun. 3, 2013, 9 pages.

Non-Final Office Action for U.S. Appl. No. 13/288,517, mailed Dec. 11, 2012, 9 pages.

Non-Final Office Action for U.S. Appl. No. 13/288,517, mailed May 16, 2013, 9 pages.

Non-Final Office Action for U.S. Appl. No. 13/226,843, mailed Mar. 4, 2013, 6 pages.

Final Office Action for U.S. Appl. No. 13/226,843, mailed Jul. 10, 2013, 7 pages.

Advisory Action for U.S. Appl. No. 13/226,843, mailed Sep. 17, 2013, 3 pages.

Non-Final Office Action for U.S. Appl. No. 13/226,843, mailed Oct. 29, 2013, 7 pages.

Non-Final Office Action for U.S. Appl. No. 13/288,273, mailed Feb. 5, 2013, 8 pages.

(56) References Cited

OTHER PUBLICATIONS

Non-Final Office Action for U.S. Appl. No. 13/288,273, mailed May 30, 2013, 11 pages.
Notice of Allowance for U.S. Appl. No. 13/288,273 mailed Oct. 24, 2013 9 pages.
Non-Final Office Action for U.S. Appl. No. 13/288,373, mailed Feb. 25, 2013, 6 pages.
Final Office Action for U.S. Appl. No. 13/288,373, mailed Aug. 2, 2013, 7 pages.
Advisory Action for U.S. Appl. No. 13/288,373, mailed Oct. 15, 2013, 3 pages.
Non-Final Office Action for U.S. Appl. No. 13/289,379, mailed Feb. 25, 2013, 9 pages.
Notice of Allowance for U.S. Appl. No. 13/289,379, mailed Jun. 6, 2013, 9 pages.
Non-Final Office Action for U.S. Appl. No. 13/304,735, mailed Jul. 11, 2013, 8 pages.
Non-Final Office Action for U.S. Appl. No. 13/304,796, mailed Jul. 17, 2013, 8 pages.
Non-Final Office Action for U.S. Appl. No. 13/304,744, mailed Jan. 24, 2013, 10 pages.
Final Office Action for U.S. Appl. No. 13/304,744, mailed May 30, 2013, 12 pages.
Advisory Action for U.S. Appl. No. 13/304,744, mailed Aug. 2, 2013, 3 pages.
Advisory Action for U.S. Appl. No. 13/304,744, mailed Sep. 13, 2013, 3 pages.
Non-Final Office Action for U.S. Appl. No. 13/304,744, mailed Oct. 21, 2013, 12 pages.
Non-Final Office Action for U.S. Appl. No. 13/305,763, mailed Mar. 8, 2013, 10 pages.
Final Office Action for U.S. Appl. No. 13/305,763, mailed Jun. 24, 2013, 13 pages.
Notice of Allowance for U.S. Appl. No. 13/305,763, mailed Sep. 16, 2013, 6 pages.
Notice of Allowance for U.S. Appl. No. 13/304,762, mailed Nov. 27, 2012, 7 pages.
Notice of Allowance for U.S. Appl. No. 13/304,762, mailed Mar. 5, 2013, 7 pages.
Non-Final Office Action for U.S. Appl. No. 13/304,943, mailed Jul. 23, 2013, 8 pages.
Notice of Allowance for U.S. Appl. No. 13/226,777, mailed May 28, 2013, 8 pages.
Non-Final Office Action for U.S. Appl. No. 13/226,777, mailed Oct. 18, 2013, 10 pages.
Notice of Allowance for U.S. Appl. No. 13/226,797, mailed Apr. 26, 2013, 8 pages.
Non-Final Office Action for U.S. Appl. No. 13/226,814, mailed Jun. 13, 2013, 13 pages.
Final Office Action for U.S. Appl. No. 13/226,814, mailed Oct. 23, 2013, 21 pages.
Non-Final Office Action for U.S. Appl. No. 13/479,816, mailed Jul. 5, 2013, 13 pages.
Final Office Action for U.S. Appl. No. 12/723,738, mailed Aug. 11, 2014, 10 pages.
Non-Final Office Action for U.S. Appl. No. 14/010,617, mailed Jul. 16, 2014, 6 pages.
Non-Final Office Action for U.S. Appl. No. 14/010,630, mailed Aug. 6, 2014, 7 pages.
Non-Final Office Action for U.S. Appl. No. 14/010,643, mailed Jul. 18, 2014, 6 pages.
Non-Final Office Action for U.S. Appl. No. 13/172,371, mailed Jun. 16, 2014, 7 pages.
Notice of Allowance for U.S. Appl. No. 13/287,726, mailed Aug. 4, 2014, 7 pages.
Non-Final Office Action for U.S. Appl. No. 13/287,672, mailed Jul. 28, 2014, 12 pages.
Notice of Allowance for U.S. Appl. No. 13/288,517, mailed Aug. 15, 2014, 7 pages.
Non-Final Office Action for U.S. Appl. No. 13/289,302, mailed Jun. 16, 2014, 7 pages.
Notice of Allowance for U.S. Appl. No. 13/304,762, mailed May 29, 2014, 7 pages.
Non-Final Office Action for U.S. Appl. No. 13/773,888, mailed Jun. 10, 2014, 15 pages.
Notice of Allowance for U.S. Appl. No. 13/656,997, mailed Sep. 2, 2014, 7 pages.

* cited by examiner

SATURATION CORRECTION WITHOUT USING SATURATION DETECTION AND SATURATION PREVENTION FOR A POWER AMPLIFIER

RELATED APPLICATIONS

This application claims the benefit of provisional patent application Ser. No. 61/175,641, filed May 5, 2009, the disclosure of which is hereby incorporated herein by reference in its entirety. This application also claims the benefit of provisional patent application 61/249,170, filed Oct. 6, 2009, the disclosure of which is hereby incorporated herein by reference in its entirety. This application further relates to U.S. Pat. No. 6,701,138, entitled "Power Amplifier Control," filed Jun. 11, 2001, which is hereby incorporated herein by reference in its entirety.

FIELD OF THE DISCLOSURE

The present disclosure relates to power amplifiers, and particularly to controlling the saturation levels of power amplifiers to maintain desirable switching spectrums for the power amplifiers' outputs.

BACKGROUND

In recent years, worldwide demand for wireless cellular communications has increased dramatically. Radiotelephones manufactured to meet this burgeoning demand must adhere to standards such as the Global System for Mobile Communications (GSM) standard. Another standard, the Digital Cellular System (DCS) standard, is based on GSM, but is directed towards higher cell density and lower power. A third standard, Personal Communications Services (PCS) is a "catch all" for many digital cellular systems, including GSM, operating in North America. These standards all require precise output power control over a large dynamic range in order to prevent a transmitter located in one cell from interfering with the reception of transmissions from other transmitters in neighboring cells.

A key component common to all radiotelephones is a radio frequency (RF) power amplifier (PA). In modern digital radiotelephones, PAs receive as input a modulated RF carrier. The radio frequency carrier is what "carries" digital information such as digitized voice or data to a cellular base station. Before reaching the PA, the RF carrier is too weak to be received by a cellular base station. Therefore, it is the function of the PA to boost the power of the RF carrier to a level sufficient for reception by a cellular base station.

In GSM radiotelephones, the adjustable power control signal must comply with a specification known as a "burst mask." The burst mask specifies the rise time, fall time, duration, and power levels associated with the adjustable power control signal. The GSM signal consists of eight equal time slots. Each time slot must conform to the burst mask specification. The output of an integrator circuit may be used to control the ramp-up time and ramp-down time of a PA control signal that is responsive to a dynamic baseband signal known as $V_{RAMP}$. The amplitude of $V_{RAMP}$ dictates that the output power of the PA must conform to the shape of the burst mask.

A problem manifests itself in the prior art due to undesirable switching transients that occur when the up and down ramp of the burst is not smooth or changes shape nonlinearly. These switching transients also occur if the control slope of the power amplifier has an inflection point within the output range, or if the control slope is very steep. In particular, this problem will occur when the integrator circuit output attempts to drive the PA beyond its maximum output power capability, as shown in FIG. 1. In this situation, the integrator will ramp up to a maximum possible voltage level such as a power supply voltage, while the output power of the PA will remain at a saturated level.

When the burst is completed, $V_{RAMP}$ needs to ramp down. However, the integrator circuit output voltage will have to first fall from the maximum possible voltage level, as shown in FIG. 2. During the time it takes for the integrator circuit output voltage to begin to fall, the PA output power will not immediately follow $V_{RAMP}$ down. However, once $V_{RAMP}$ decreases to a voltage level in which the PA is once again controllable, the integrator circuit output voltage must "catch up" with $V_{RAMP}$. As a result, there will be a sharp drop in the PA's output power, as shown in FIG. 3. As illustrated in FIG. 4, this sharp drop in the PA's output power typically results in failure of the European Telecommunications Standards Institute (ETSI) switching spectrum specification. Notice that both the −400 kHz signal and the +400 kHz signal exceed the ETSI limit as $V_{RAMP}$ descends.

Thus, there remains a need to provide a circuit and methodology for controlling the saturation levels of power amplifiers to prevent switching transients and maintain desirable switching spectrums for the power amplifiers' outputs.

SUMMARY OF THE DISCLOSURE

The present disclosure provides for control of a power amplifier (PA). In particular, the present disclosure provides a power control circuit and method that provide a saturation correction for a PA in order to maintain a desirable switching spectrum. The power control circuit includes a closed loop system that is responsive to a dynamic baseband signal known as $V_{RAMP}$. The dynamic baseband signal ($V_{RAMP}$) has an amplitude that dictates the amount of output power delivered by the PA.

The method samples a feedback signal from the PA in order to capture a sample value, such as a detector voltage, that represents the output of the PA when $V_{RAMP}$ is at or near a maximum level. A fixed dc signal has a magnitude that is derived from the sample value by subtracting a predetermined value from the sample value. The fixed dc signal is applied as a new PA control signal in place of the dynamic baseband signal ($V_{RAMP}$). Preferably the predetermined value is selected to decrease the output power of the PA by a fraction of a decibel (dB).

In response to the fixed dc signal, an integrator circuit comprising the closed loop system will force the feedback signal from the PA to equal the fixed dc signal. As a result, the saturation of the PA will be compensated without using a circuit or method for detecting PA saturation. As the amplitude of the dynamic baseband signal ($V_{RAMP}$) decreases, the dynamic baseband signal ($V_{RAMP}$) is reapplied as a dynamic PA control signal in place of the fixed dc signal. In this way, the PA will not experience an abrupt control input that would generate an undesirable switching spectrum.

Moreover, a saturation prevention method is disclosed that can cooperate with the above disclosed power control circuit and method in order to eliminate the possibility of undesirable power reductions for abnormal operating conditions, such as a low battery voltage supply to the PA being controlled. With the saturation prevention method, the power control circuit may be selectably enabled by a baseband control system to automatically reduce a fixed output power of the PA by a predetermined amount of offset power for power levels above a given power level during transmission of an RF signal. However, the fixed output power is maintained, not reduced, for power levels below the given power level. The power levels available to the PA that are above the given power level are calibrated to include the predetermined amount of offset power. In this way, PA output power at power levels above the given power level will be reduced to a desirable magnitude, whereas PA output power at levels below the given power level will be maintained at a desirable magnitude even in abnormal operating conditions such as a low battery voltage supply for the PA, etc.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice embodiments of the disclosure and illustrate the best mode of practicing the principles of the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 5:
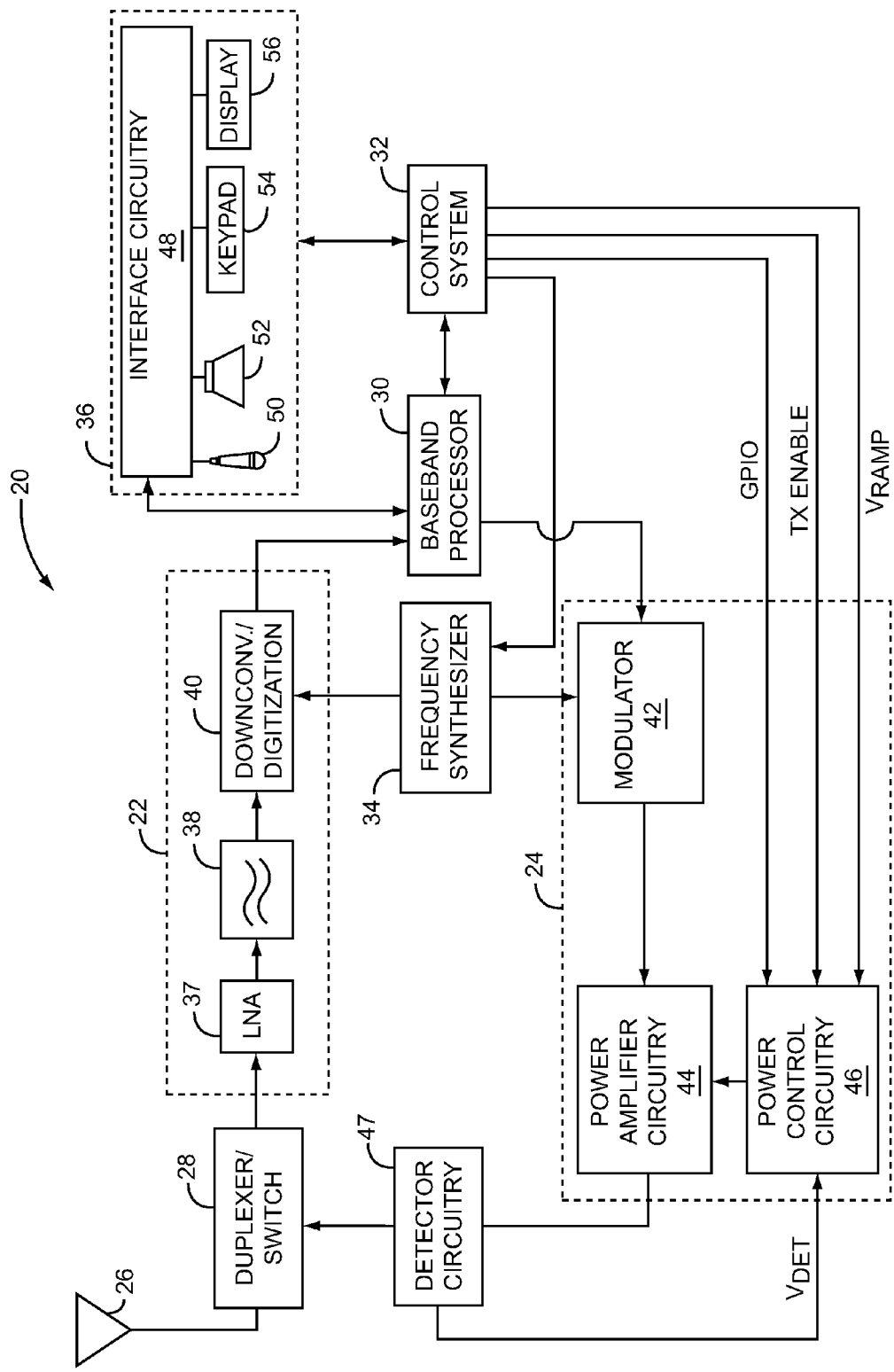
FIG. 5 depicts a mobile terminal having PA control circuitry according to an embodiment of the present disclosure.

With reference to FIG. 5, an embodiment of the present disclosure is preferably incorporated in a mobile terminal 20, such as a mobile telephone, personal digital assistant (PDA), or the like. The basic architecture of the mobile terminal 20 may include a receiver front end 22, a radio frequency (RF) transmitter section 24, an antenna 26, a duplexer or switch 28, a baseband processor 30, a control system 32, a frequency synthesizer 34, and an interface 36. The receiver front end 22 receives information bearing RF signals from one or more remote transmitters provided by a base station. A low noise amplifier (LNA) 37 amplifies the signal. A filter circuit 38 minimizes broadband interference in the received signal, while a downconverter 40 downconverts the filtered received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data from the control system 32, which it encodes for transmission. The encoded data is output to the RF transmitter section 24, where it is used by a modulator 42 to modulate a carrier signal that is at a desired transmit frequency. Power amplifier circuitry 44 amplifies the modulated carrier signal to a level appropriate for transmission from the antenna 26.

As described in further detail below, the power amplifier circuitry 44 provides gain for the signal to be transmitted under control of power control circuitry 46, which is preferably controlled by the control system 32 using the $V_{RAMP}$ signal. A detector circuit 47 provides a feedback signal ($V_{DET}$) from the output of the power amplifier circuitry 44 to the power control circuitry 46. Preferably, the bias for the power amplifier circuitry 44 is relatively stable regardless of power, and varying the voltage supplied to the power amplifier circuitry 44 controls actual power levels. The control system 32 may also provide a transmit enable (TX ENABLE) signal to effectively turn the power amplifier circuitry 44 and power control circuitry 46 on during periods of transmission. The control system 32 may also include a general purpose input/output (GPIO) signal line for sending commands and data to the power control circuitry 44.

A user may interact with the mobile terminal 20 via the interface 36, which may include interface circuitry 48 associated with a microphone 50, a speaker 52, a keypad 54, and a display 56. The interface circuitry 48 typically includes analog-to-digital converters, digital-to-analog converters, amplifiers, and the like. Additionally, it may include a voice encoder/decoder, in which case it may communicate directly with the baseband processor 30.

The microphone 50 will typically convert audio input, such as the user's voice, into an electrical signal, which is then digitized and passed directly or indirectly to the baseband processor 30. Audio information encoded in the received signal is recovered by the baseband processor 30, and is converted into an analog signal suitable for driving speaker 52 by the input/output and interface circuitry 48. The keypad 54 and display 56 enable the user to interact with the mobile terminal 20 by inputting numbers to be dialed, address book information, or the like, and monitoring call progress information.

Figure 6:
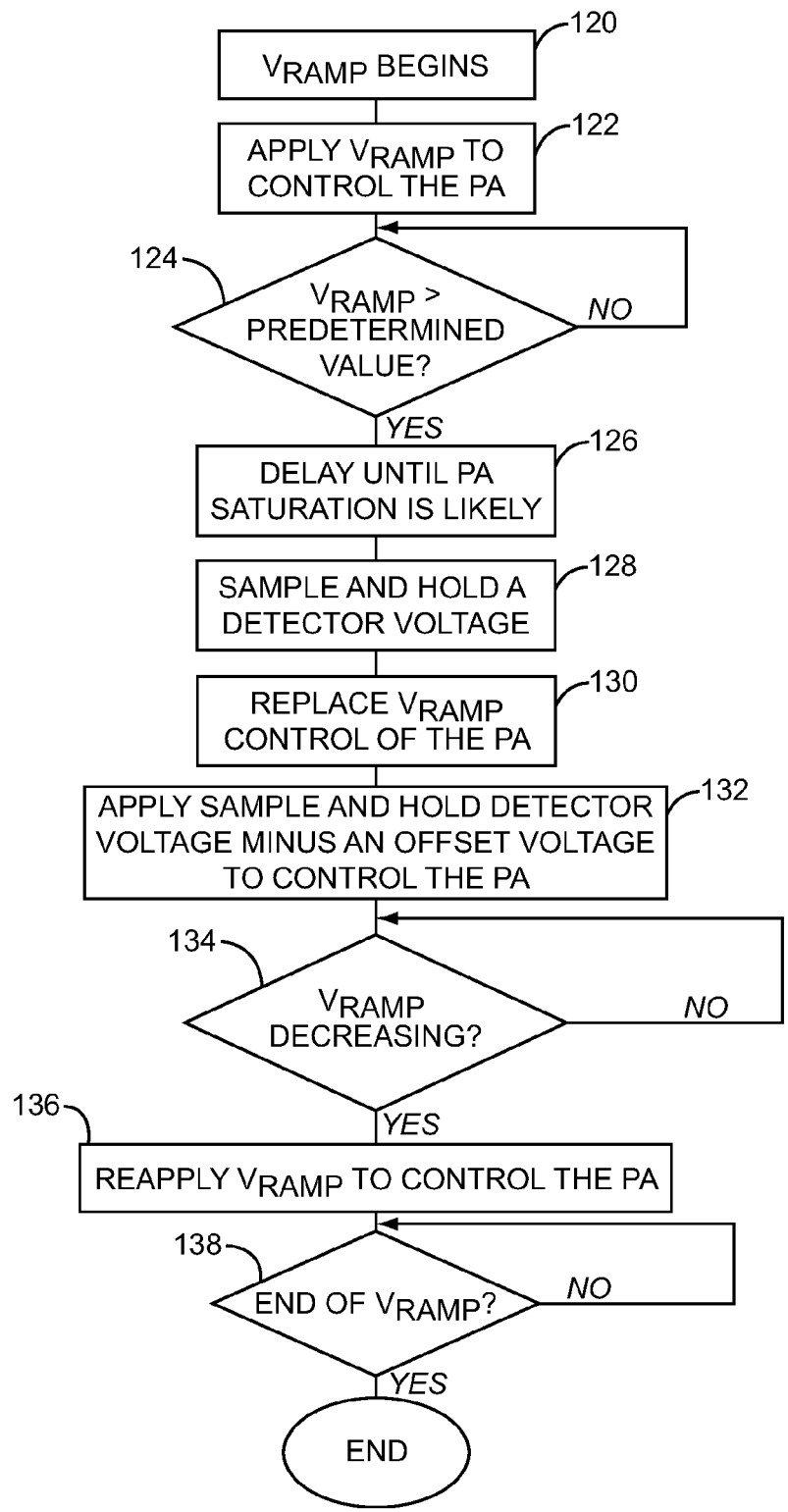
FIG. 6 is a flowchart that illustrates a method according to the present disclosure for correcting a saturation of a PA.

Turning now to FIG. 6, a method according to the present disclosure provides saturation correction for a PA of power amplifier circuitry 44 (FIG. 5) without using saturation detection. The disclosed method may be implemented using the power control circuitry 46 of FIG. 5. As shown by the flowchart of FIG. 6, the disclosed saturation correction method begins with a dynamic baseband signal ($V_{RAMP}$) that linearly increases from an initial voltage such as a pedestal of a few tenths of a volt (step 120). Preferably, the control system 32 (FIG. 5) provides the $V_{RAMP}$ signal to the power control circuitry 46 (FIG. 5).

The power control circuitry 46 receives the $V_{RAMP}$ signal as input, and in turn integrates the $V_{RAMP}$ signal with the feedback signal ($V_{DET}$) to produce an output to the power amplifier circuitry 44 (step 122). The detector circuit 47 (FIG. 5) provides the feedback signal $V_{DET}$, which in this case is not used to detect PA saturation.

An inherent delay is maintained until the $V_{RAMP}$ signal increases to a voltage level that is above a predetermined voltage level (step 124). In an example embodiment, the predetermined voltage level corresponds to a PA output power that is slightly greater than 20 dBm. Once the $V_{RAMP}$ signal exceeds the predetermined voltage level, a predetermined delay is initiated (step 126). The predetermined delay is preferably around 120 microseconds (μS). Other values of delay can be used depending on a user's particular baseband application.

A sample voltage of the feedback signal $V_{DET}$ is captured once the predetermined delay has expired (step 128). Next, the control of the output from the power amplifier circuitry 44 via the dynamic $V_{RAMP}$ signal is removed while a constant voltage equal to the $V_{RAMP}$ sample voltage is maintained as output to the power amplifier circuitry 44 (step 130). Practically instantaneously, a value of voltage equal to the $V_{DET}$ sample voltage minus a predetermined offset voltage is applied to the power amplifier circuitry 44 (step 132). The predetermined offset voltage is selected such that the PA of the power amplifier circuitry 44 is slightly below the saturated power level at the time the dynamic $V_{RAMP}$ signal is removed from controlling the output of the power control circuitry 46. A preferred offset voltage value is selectable to decrease the amount output power delivered by the power amplifier circuitry 44 during saturation by a fraction of a dBm.

At some point in time, the $V_{RAMP}$ signal reaches a maximum voltage level and begins a voltage decrease. An output voltage of the power control circuitry 46 is maintained with the level of the $V_{DET}$ sample voltage minus the offset voltage until the $V_{RAMP}$ signal voltage decreases (step 134). Once the $V_{RAMP}$ voltage begins to decrease, the dynamic $V_{RAMP}$ signal is reapplied within the power amplifier circuitry 44 such that the dynamic $V_{RAMP}$ signal is integrated with the feedback signal ($V_{DET}$) to provide output for controlling the power of the PA of the power amplifier circuitry 44 (step 136). The dynamic $V_{RAMP}$ signal continues to dictate the PA output until the completion of the ramp down of the dynamic $V_{RAMP}$ signal (step 138). As another GSM burst approaches, the $V_{RAMP}$ signal begins again (step 120).

Figure 7:
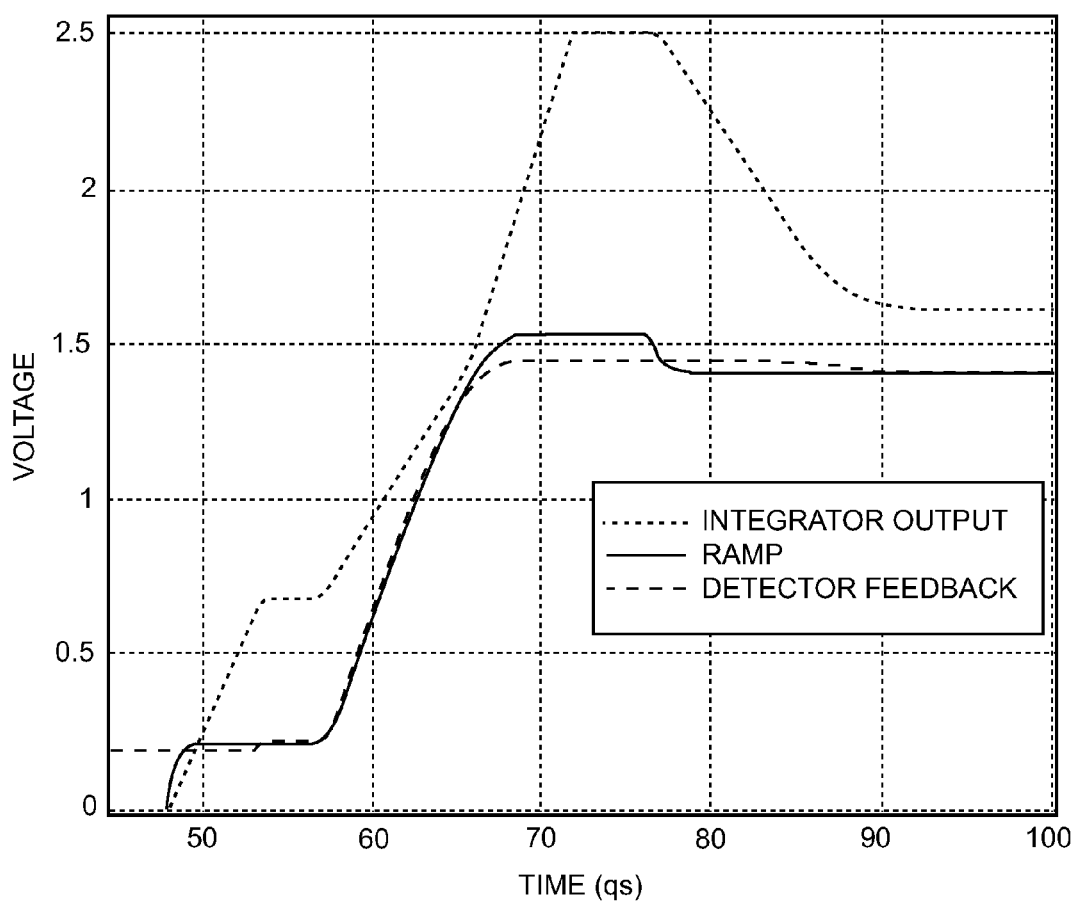
FIG. 7 depicts the response of the PA control signal waveforms to the method of FIG. 6 at the beginning of a GSM burst.

FIG. 7 depicts an example of a typical response of the PA control signal waveforms to the method of FIG. 5 at the beginning of a GSM burst. Notice that between about 57 quarter symbols (qs) and 77 qs, the ramp waveform is provided by the dynamic $V_{RAMP}$ signal. At about 77 qs into the ramp signal, the dynamic $V_{RAMP}$ signal is replaced by the sample and hold voltage of the $V_{DET}$ minus an offset voltage of a few tenths of a volt. In response to the now slightly lower voltage level for the ramp signal, the integrator output voltage level falls away from a maximum voltage level that is typically the voltage of a supply rail that provides power to the power control circuitry 46 (FIG. 5), and thus is no longer saturated.

Figure 1:
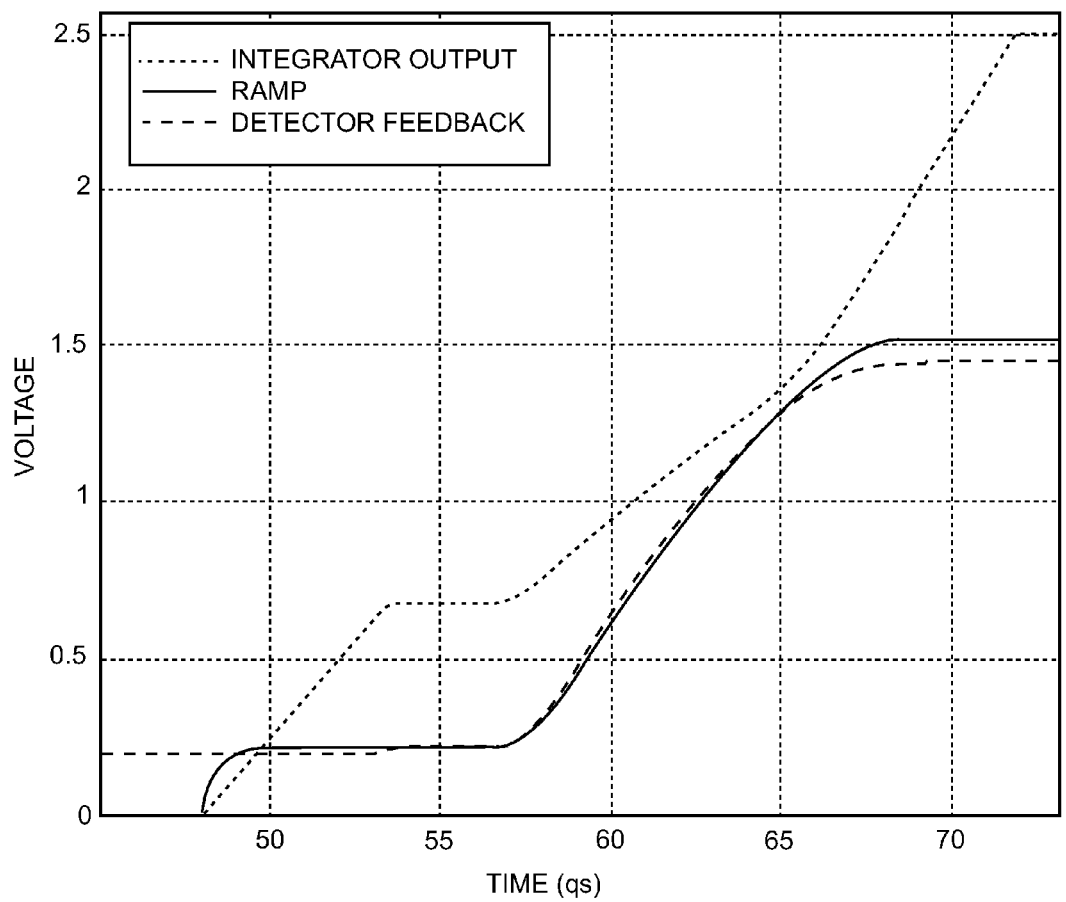
FIG. 1 depicts power amplifier (PA) control signal waveforms associated with the beginning of a GSM burst.
Figure 2:
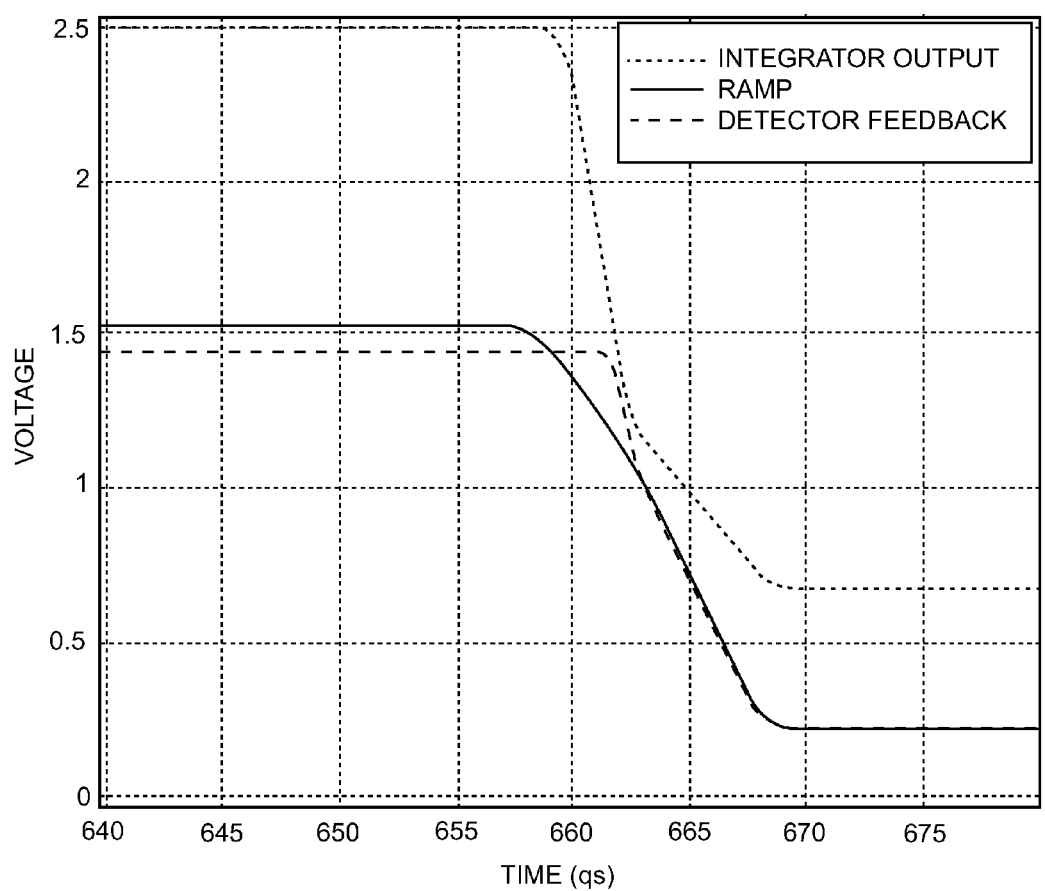
FIG. 2 depicts PA control signal waveforms associated with the end of a GSM burst.
Figure 3:
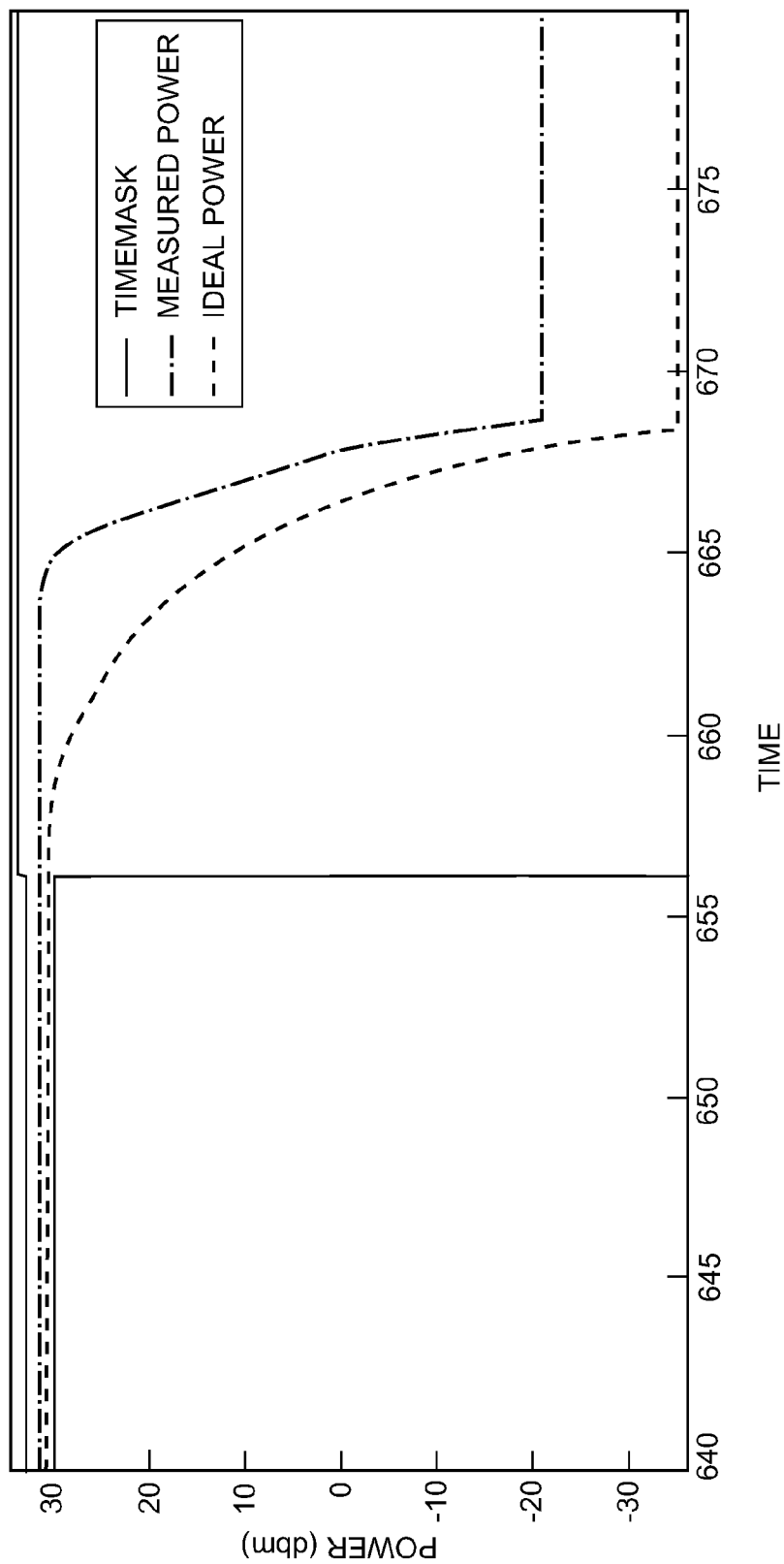
FIG. 3 depicts an undesirable effect of saturation on a PA output power at the end of the GSM burst as the voltage of the PA control signal drops steeply.
Figure 8:
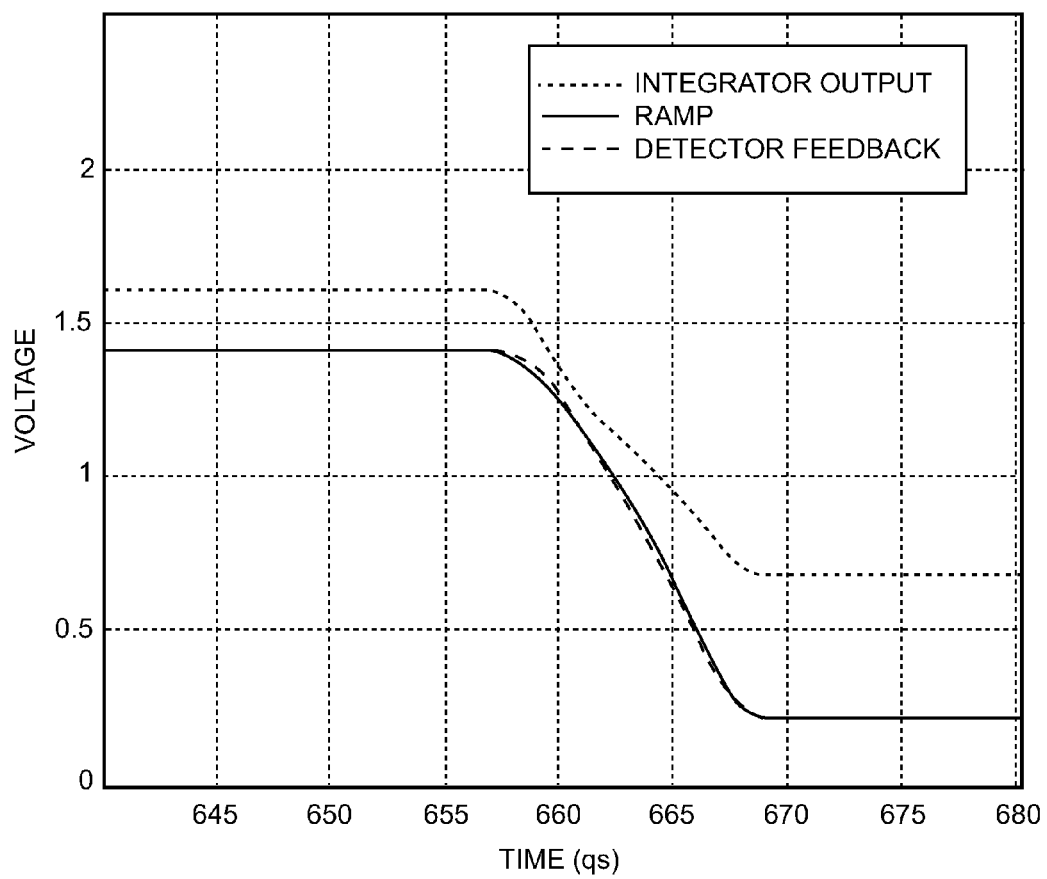
FIG. 8 depicts the response of the PA control signal waveforms to the method of FIG. 6 at the end of a GSM burst.

FIG. 8 depicts the response of the PA control signal waveforms to the method of FIG. 5 at the end of a GSM burst. Notice that by about 657 qs, the dynamic $V_{RAMP}$ signal once again provides the ramp waveform. However, in contrast to the typical integrator output voltage level shown in FIG. 2, the integrator output voltage level shown in FIG. 8 is not at a maximum voltage level. Instead, the integrator output voltage level is well below the maximum voltage level and corresponds to an output power level that is not saturated. Thus, the feedback loop of the integrator is active and can respond correctly to changes in the dynamic $V_{RAMP}$ signal.

Figure 4:
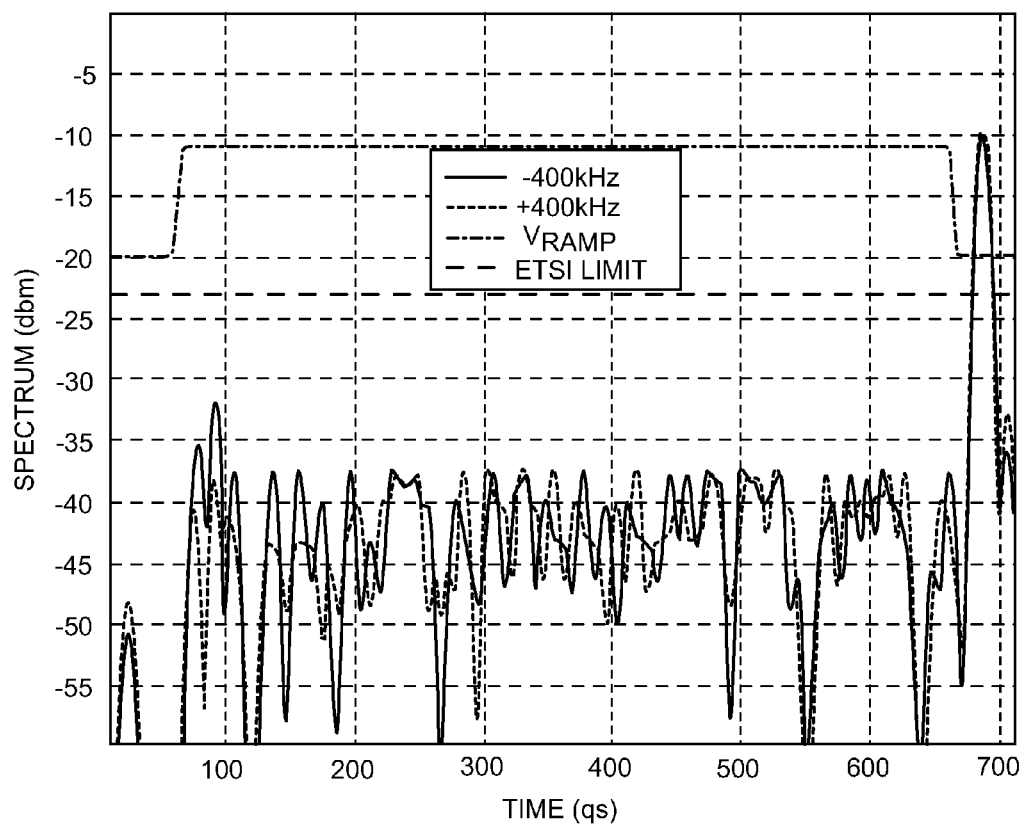
FIG. 4 illustrates a severe degradation of the output switching spectrum due to a steep change in PA power output.
Figure 9:
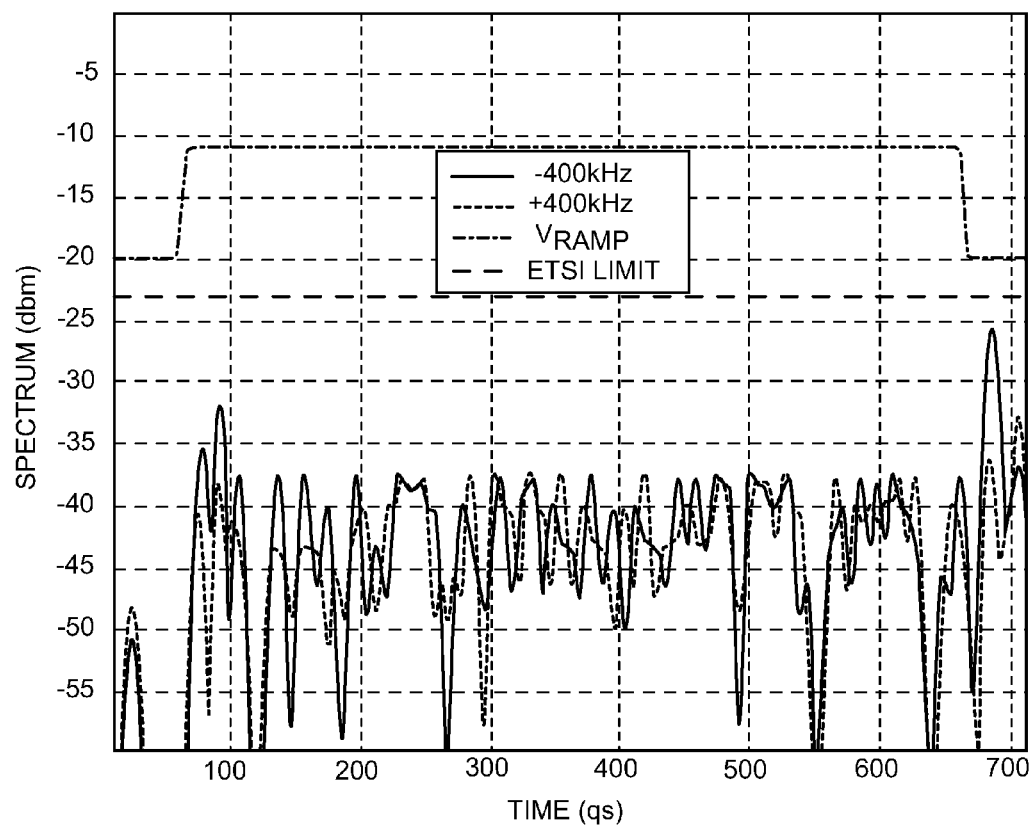
FIG. 9 illustrates the improved output switching spectrum resulting from the implementation of the method of FIG. 6.

FIG. 9 illustrates the improved output switching spectrum that results from the disclosed method that eliminates a need for the integrator output voltage to follow the dynamic $V_{RAMP}$ signal with a steep descent. Notice that in FIG. 9 both the +400 kHz spectrum and the −400 kHz spectrum fall well below the ETSI spectrum limit. In fact, at the critical time around 657 qs when the $V_{RAMP}$ signal's voltage begins to transition from near maximum PA power, the +400 kHz spectrum and the −400 kHz spectrum improves on the order of −15 db in comparison with the same time period depicted in FIG. 4.

Figure 10:
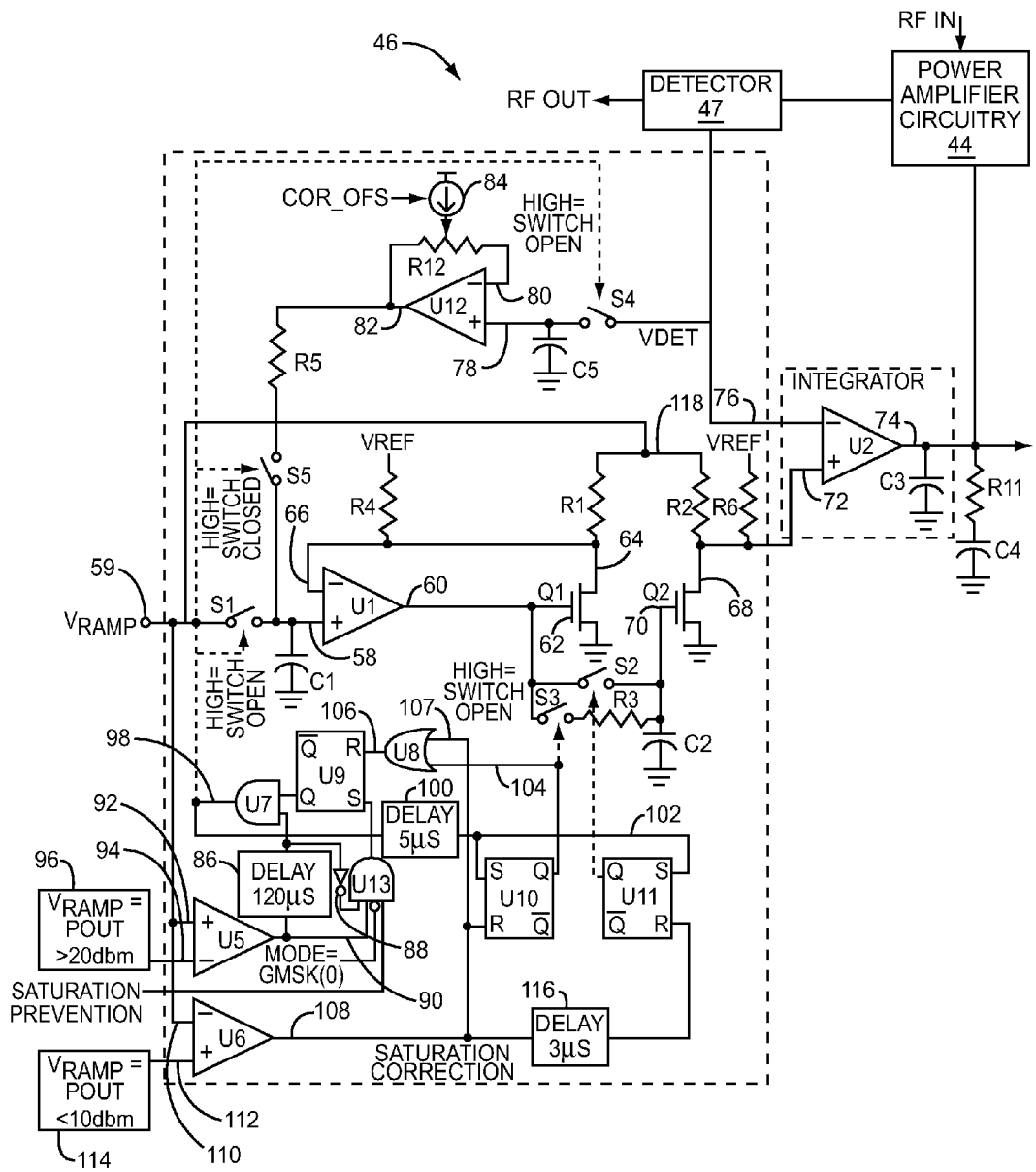
FIG. 10 is a detailed schematic of the power control circuitry of FIG. 5 that is in accordance with the present disclosure.

Turning now to FIG. 10, a detailed schematic of the power control circuitry 46 of FIG. 5 is disclosed. A first terminal of a capacitor C1 is coupled to a non-inverting input 58 of an op amp U1 and a second terminal of the capacitor C1 is coupled to a fixed voltage reference and, in this case, ground. The non-inverting input 58 selectably receives a $V_{RAMP}$ signal through a switch S1 and a $V_{RAMP}$ input 59. The op amp U1 has an output terminal 60 coupled to a gate 62 of a transistor Q1. A drain 64 of the transistor Q1 is coupled to the inverting input 66 of op amp U1 such that the voltage on the non-inverting input 58 will be reproduced on the drain 64 of the transistor Q1.

The $V_{RAMP}$ signal is coupled to the drain 64 of the transistor Q1 through a resistor R1. The $V_{RAMP}$ signal is also coupled to a drain 68 of a transistor Q2 through a resistor R2. A gate 70 of the transistor Q2 is selectably coupled through a switch S2 to the gate 62 of the transistor Q1. The gate 70 of the transistor Q2 is also selectably coupled through a resistor R3 and a switch S3 to the gate 62 of the transistor Q1. A capacitor C2 has a first terminal coupled to the gate 70 of the transistor Q2 and a second terminal coupled to ground. The capacitor C2 is usable to maintain a voltage on the gate 70 of the transistor Q2 when the switch S3 is open. The resistor R3, along with the capacitor C2, sets a smooth transition of the voltage on the gate 70 when the switch S3 closes. After this transition is essentially complete, the switch S2 closes to insure the voltage is fully settled.

The drain 68 of the transistor Q2 is also coupled to a non-inverting input 72 of an op amp U2. An output 74 provides a PA control signal for the power amplifier circuitry 44. The output 74 is also coupled to a first terminal of a capacitor C3. The capacitor C3 has a second terminal coupled to ground. The output 74 is also coupled to a resistor-capacitor filter made up of a resistor R11 that is in series with a capacitor C4 that has a terminal coupled to ground. An inverting input 76 of the op amp U2 is coupled to the detector circuit 47, which is coupled to an output of the power amplifier circuitry 44.

In this preferred embodiment of the disclosure, the op amp U2 is a transconductance amplifier. As configured in FIG. 10, the op amp U2 and capacitor C3 form an integrator that integrates signals that are applied to the non-inverting input 72 and the inverting input 76. In this case, the $V_{RAMP}$ signal is periodically applied to the non-inverting input 72, whereas the feedback signal $V_{DET}$ provided by the detector circuit 47 is continuously applied to the inverting input 76.

The feedback signal $V_{DET}$ is also selectably applied to a non-inverting input 78 of an op amp U12 through a switch S4. A capacitor C5 is coupled to the non-inverting input 78 and ground. An inverting input 80 of the op amp U12 is coupled through a variable resistor R12 to an output terminal 82 of the op amp U12. This particular configuration of U12 forms a sample-and-hold-type circuit.

A current source 84 is tapped into the variable resistor R12 to provide a correction offset voltage signal (COR_OFS) that is summed with a $V_{DET}$ sample voltage held by the capacitor C5. The output terminal 82 is selectably coupled through a resistor R5 and the switch S5 to the non-inverting input 58 of the op amp U1. The resistor R5 forms an RC time constant with the capacitor C1 such that when the switch S1 opens and the switch S5 closes there will be a smooth transition between what may be two different voltage levels. The resistance value of R5 preferably provides an RC time constant of one or two microseconds.

An AND gate U13 receives four inputs. One input signal is a baseband signal (i.e., SATURATION PREVENTION) that is usable for a saturation prevention mode. Another input signal (MODE=GMSK(0)) is used to signify whether or not the power amplifier circuitry 44 is to operate in GMSK mode. Yet another input signal signifies whether or not the $V_{RAMP}$ signal will yield a PA output power ($P_{OUT}$) that is greater than a 20 dBm power reference. Other power level references could be selected, but 20 dBm is a convenient choice because the PA of power amplifier circuitry 44 will typically not saturate at power levels of less than 20 dBm. One more input signal is a delay signal from a DELAY 86. The delay signal from the DELAY 86 is inverted by an inverter gate 88 before the delay signal reaches the input of the AND gate U13.

The DELAY 86 is triggered from an output terminal 90 of an op amp U5. The op amp U5 has a non-inverting input 92 coupled to the $V_{RAMP}$ input 59 and an inverting input 94 coupled to a voltage reference 96. Preferably, the voltage reference 96 is equal to a voltage of $V_{RAMP}$ that yields a $P_{out}$ of 20 dBm. The delay signal from the DELAY 86 also is inputted into an AND gate U7 that also receives input from a Q output of a set/reset (SR) flip-flop U9. The AND gate U7 has an output terminal 98 that controls the opening and closing of switches S1, S4 and S5.

The output terminal 98 of the AND gate U7 is also coupled to a DELAY 100 that is triggered when the logic state of the AND gate U7 transitions from a logic low to a logic high. An output terminal 102 of the DELAY 100 is coupled to the S input of an SR flip-flop U10 and to the S input of an SR flip-flop U11. A Q output of the SR flip-flop U10 controls the opening and closing of the switch S3, while a Q output of the SR flip-flop U11 controls the opening and closing of the switch S2. Moreover, the Q output of the SR flip-flop U10 feeds an input terminal 104 of an OR gate U8, which in turn has an output terminal 106 that feeds an R input of the SR flip-flop U9. The OR gate U8 has another input terminal 107 that is coupled to an output terminal 108 of an op amp U6. The op amp U6 has an inverting input 110 coupled to the $V_{RAMP}$ input 59 and a non-inverting input 112 coupled to a voltage reference 114 that has a voltage equal to a voltage of $V_{RAMP}$ that yields a $P_{out}$ of 10 dBm. The output terminal 108 of the op amp U6 is also coupled to a DELAY 116 that feeds a delay signal to an R input to SR flip-flop U11.

At the beginning of operation, the switches S1, S2, S3, and S4 are closed, while the switch S5 is open. As a result of this beginning configuration of the switches S1, S2, S3, S4, and S5, an equivalent of the $V_{RAMP}$ signal is inputted to the non-inverting input 72 of the op amp U2, which performs the integrator function along with capacitor C3.

Once $V_{RAMP}$ rises to a level that urges the PA of power amplifier circuitry 44 to deliver a power level greater than 20 dBm, and while at the same time the SATURATION PREVENTION signal is at a logic high, and the GMSK(0) signal is at a logic low, and the output of the DELAY 86 is at a logic low, the AND gate U13 will output a logic high. The logic high output of the AND gate U13 will set the Q output of a flip-flop U9 to a logic high level. Moreover, a timing function of the DELAY 86 will begin.

The AND gate U7 receives the Q output of flip-flop U9 and the logic output of the DELAY 86. At first, the output of the DELAY 86 is low. However, the output of the DELAY 86 will transition to a logic high as soon as the delay time has expired. The delay time expiration should insure that the $V_{RAMP}$ signal is at a maximum. The delay time for the DELAY 86 may be preset to be as short as 20 microseconds or as great as 125 microseconds depending on the specific needs of the baseband system. Note also that when the output of delay goes high, the output of an inverter gate 88 coupled to an input of the AND gate U13 goes low. Nevertheless, the Q output of the SR flip-flop U9 will remain unchanged. However, it is important to remove the high logic level from the S input of the flip-flop U9 after the delay, because at some point the flip-flop U9 will be reset by a high logic level. This is because a high logic level is not simultaneously allowable on both the S and R inputs of the flip-flop U9.

Now that the AND gate U7 has both inputs at a logic high, the output of the AND gate U7 will go to a logic high, which in turn will open the switches S1 and S4 and close the switch S5. The capacitor C5, which is coupled to the non-inverting input 78 of op amp U12, is by now charged with a sample of the feedback signal $V_{DET}$, which is provided by the detector circuit 47. The saturation correction offset signal (COR_OFS) is subtracted from the voltage of C5, which is the sample and hold voltage captured from the feedback signal $V_{DET}$. The sample and hold voltage held by the capacitor C5 minus the COR_OFS is outputted from the output terminal 82 of op amp U12. Since switch S5 is closed at this time, the capacitor C1 is charged to the sampled detector voltage that is present at the non-inverting input 78 of U12 minus the COR_OFS signal voltage.

In response, an output voltage at the output terminal 60 of the op amp U1 is applied to the gate 62 of the transistor Q1 such that the voltage impressed upon the non-inverting input 58 from the charged capacitor C1 appears at the drain 64 of the transistor Q1. Similarly, the output of the op amp U1 is applied to the gate 70 of the transistor Q2 through the closed switch S2 such that the voltage impressed upon the non-inverting input 58 of the op amp U1 from the charged capacitor C1 appears at the drain 68 of the transistor Q2. Since the drain 68 of the transistor Q2 is directly coupled to the non-inverting input 72 of the op amp U2, the output of the op amp U2 will be equal to the sampled $V_{DET}$ detector voltage of capacitor C5 minus the saturation correction offset voltage COR_OFS. The output of the op amp U2 is applied to the power amplifier circuitry 44 for the duration of the burst.

When the output of the AND gate U7 goes high, the DELAY 100 starts a 5 microsecond delay. At the end of the 5 microsecond delay, the SR flip-flop U10 is set, which forces the Q output of the SR flip-flop U10 to transition from a logic low to a logic high, thereby opening the switch S3. The SR flip-flop U11 is also set at the end of the 5 microsecond delay, which results in the opening of the switch S2 when the Q output of the SR flip-flop U10 is forced high. However, the capacitor C2 remains charged and applies a voltage to the gate 70 of the transistor Q2 such that the sampled detector voltage of capacitor C5 minus the saturation correction offset voltage COR_OFS will remain on the drain 68 of the transistor Q2. Therefore, until the $V_{RAMP}$ signal decreases to a voltage level that begins to bring the PA of power amplifier circuitry 44 out of saturation, the sampled detector voltage of capacitor C5 minus the saturation correction offset voltage COR_OFS will remain on the non-inverting input 72 of the op amp U2.

Once the $V_{RAMP}$ signal descends, the voltage on the non-inverting input 72 of the op amp U2 will follow the $V_{RAMP}$ signal. This is because the $V_{RAMP}$ signal is applied directly to a common node 118 of the resistor R1 and the resistor R2.

As soon as the $V_{RAMP}$ signal voltage drops to a point at which the output power of the PA of the power amplifier circuitry 44 is less than 10 dBm, the output of op amp U6 will transition from a logic low to a logic high. The outputted logic high from op amp U6 will force the output of the OR gate U8 to transition from a logic low to a logic high, which in turn will reset the SR flip-flop U9. As a result, the output of the AND gate U7 will transition from a logic high to a logic low, causing the switch S1 and the switch S4 to close. Simultaneously, the switch S5 will be opened. The high output of the op amp U6 will also reset the SR flip-flop U10, which will close the switch S3 and will initiate the DELAY 116 to start a 3 microsecond delay. After the 3-microsecond delay expires, the SR flip-flop U11 is reset, and the Q output of the SR flip-flop U11 transitions from a logic high to a logic low, thereby closing switch S2. At this point, the power control circuitry 46 is ready for another $V_{RAMP}$ cycle.

A saturation prevention method is also disclosed to cooperate with the power control circuit 46 and method of FIG. 6 in order to eliminate the possibility of undesirable power reductions for abnormal operating conditions, such as a low battery voltage supply to the power amplifier circuitry 44. With the saturation prevention method, the power control circuit 46 may be selectably enabled by the control system 32 (FIG. 5) to automatically reduce a fixed output power of the PA by a predetermined amount of offset power for power levels above a given power level during transmission of an RF signal. However, the fixed output power is maintained, not reduced, for power levels below the given power level. The power levels available to the PA that are above a given power level are calibrated to include the predetermined amount of offset power, such as an additional 0.3 db. In this way, even in abnormal operating conditions, such as a low battery voltage for the power amplifier circuitry 44, the PA output power at power levels above the given power level will be reduced to a desirable magnitude, whereas PA output power at levels below the given power level will be maintained at a desirable magnitude.

In order to implement the saturation prevention method, the control system 32 can use the GPIO signal line (FIG. 5) to transmit a baseband data signal having a value (e.g., COR_OFS) that is indicative of the predetermined amount of offset power. A typical value for the predetermined amount of offset power is 0.3 dB. For example, a power level known as a power control level (PCL) for the ETSI standard is 24 dBm. In this example, the 24 dBm is the given power level for which higher power levels have the power offset added during calibration of the power amplifier circuitry 46. In this case, the next highest ETSI PCL of 26.0 dBm would be calibrated to equal 26.3 dBm. Likewise, an ETSI PCL of 28.3 dBm would be calibrated to 28.6 dBm and an ETSI PCL of 30 dBm would be calibrated to equal 30.3 dBm.

Figure 11:
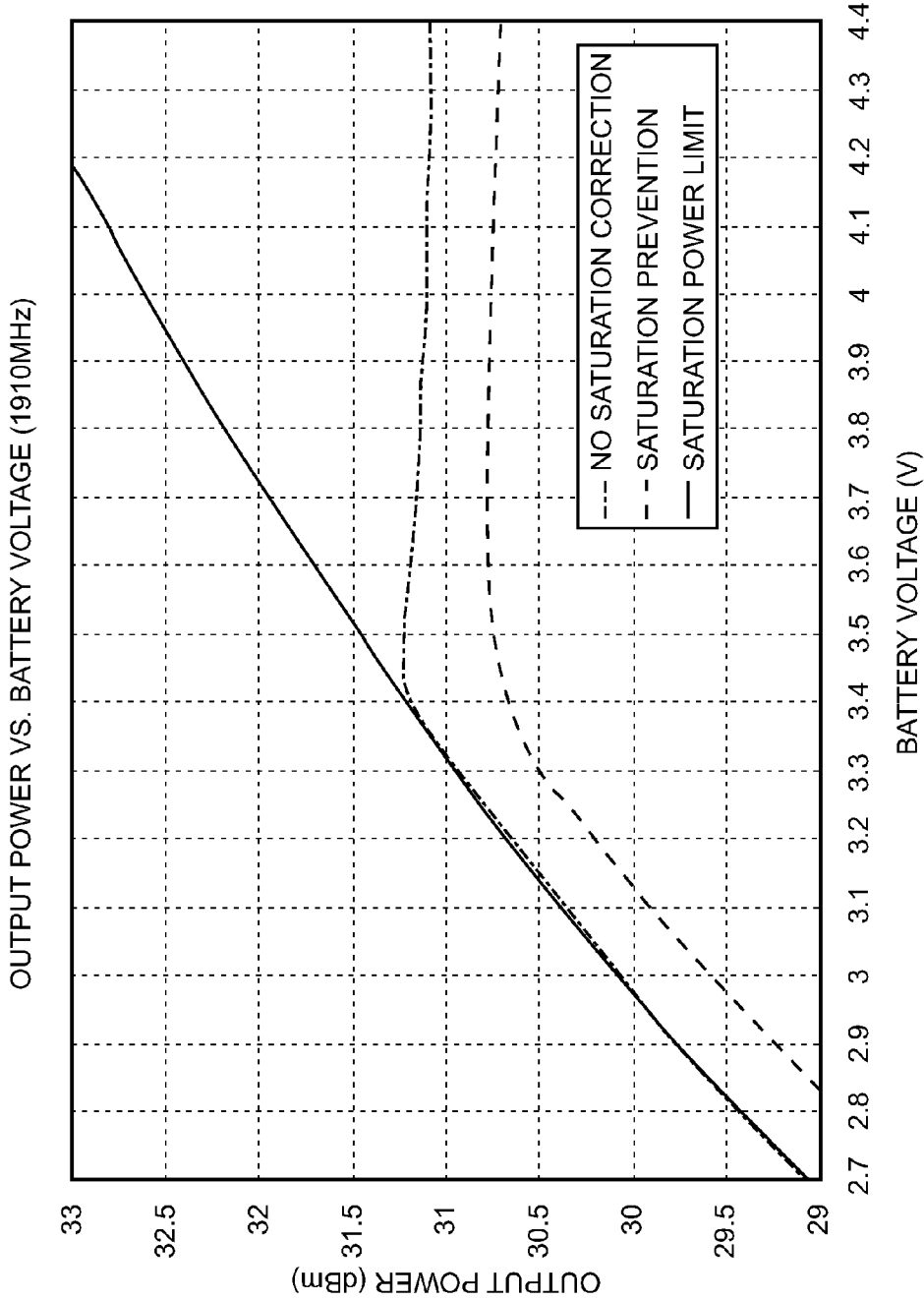
FIG. 11 is a graph of PA output power versus battery voltage illustrating the results of the saturation prevention method combined with the saturation correction method.

FIG. 11 is a graph that depicts a customer's desire to have an output power of 31.1 dBm with no saturation correction, and an output power of 30.8 dBm with saturation prevention. Notice that at points on the graph wherein the battery voltage begins to droop, the saturation correction power output will follow a saturation power limit, whereas the saturation prevention output will always be below the saturation prevention output by the amount of the power offset. In this case, the power offset is 0.3 dBm.

Figure 12:
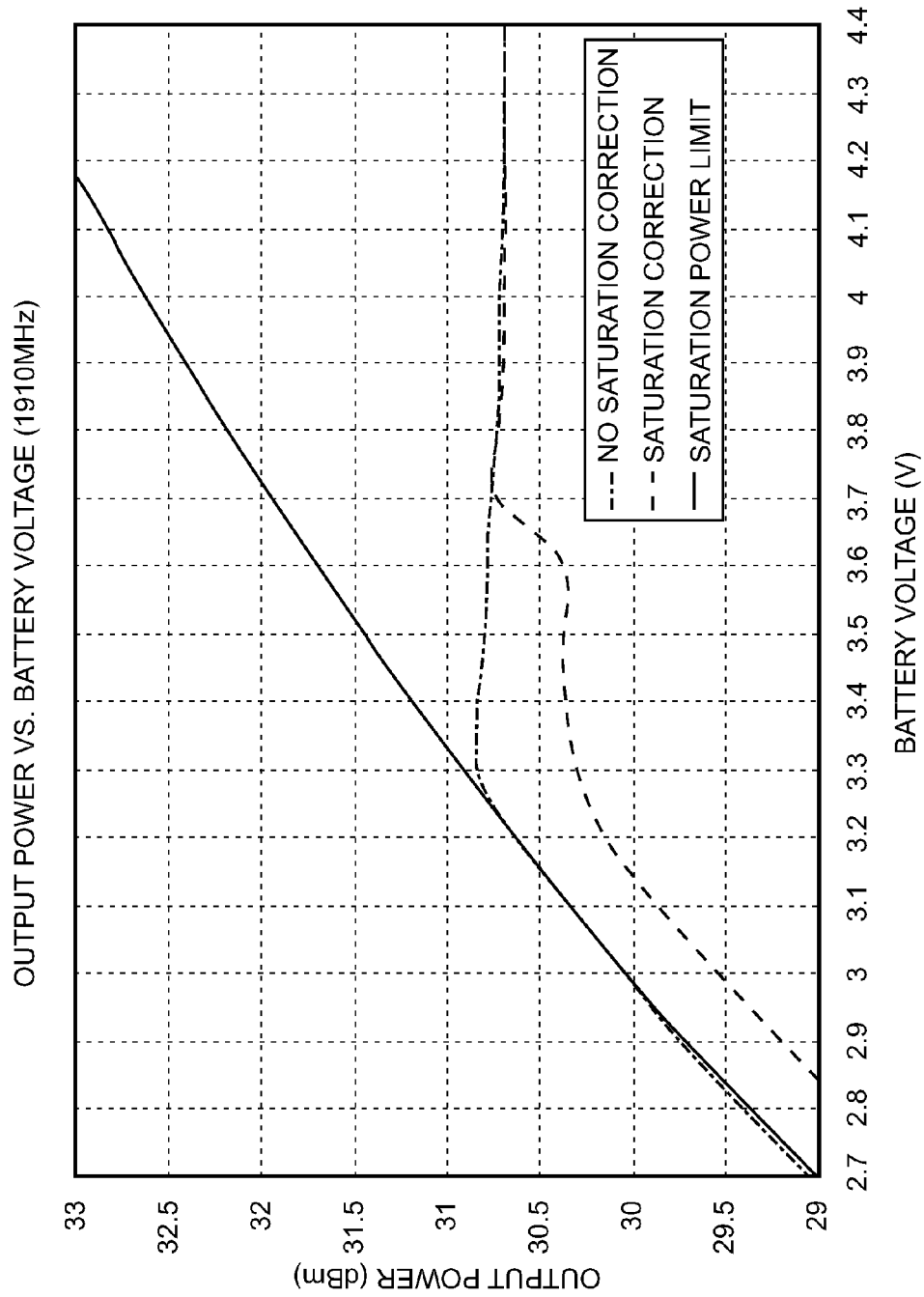
FIG. 12 is a graph of PA output power versus battery voltage illustrating the results of the saturation correction method without the saturation prevention method.

FIG. 12 is a graph showing a saturation detection and correction type method that dictates PA output power until the battery voltage drops below about 3.7V, at which point the saturation correction method takes over. However, in this case, saturation correction by itself reduces output power by too much. Turning back to FIG. 11, notice that the saturation correction method would not reduce the PA output power by too much because the saturation prevention method provides the additional offset power amount of 0.3 dB.

Figure 13:
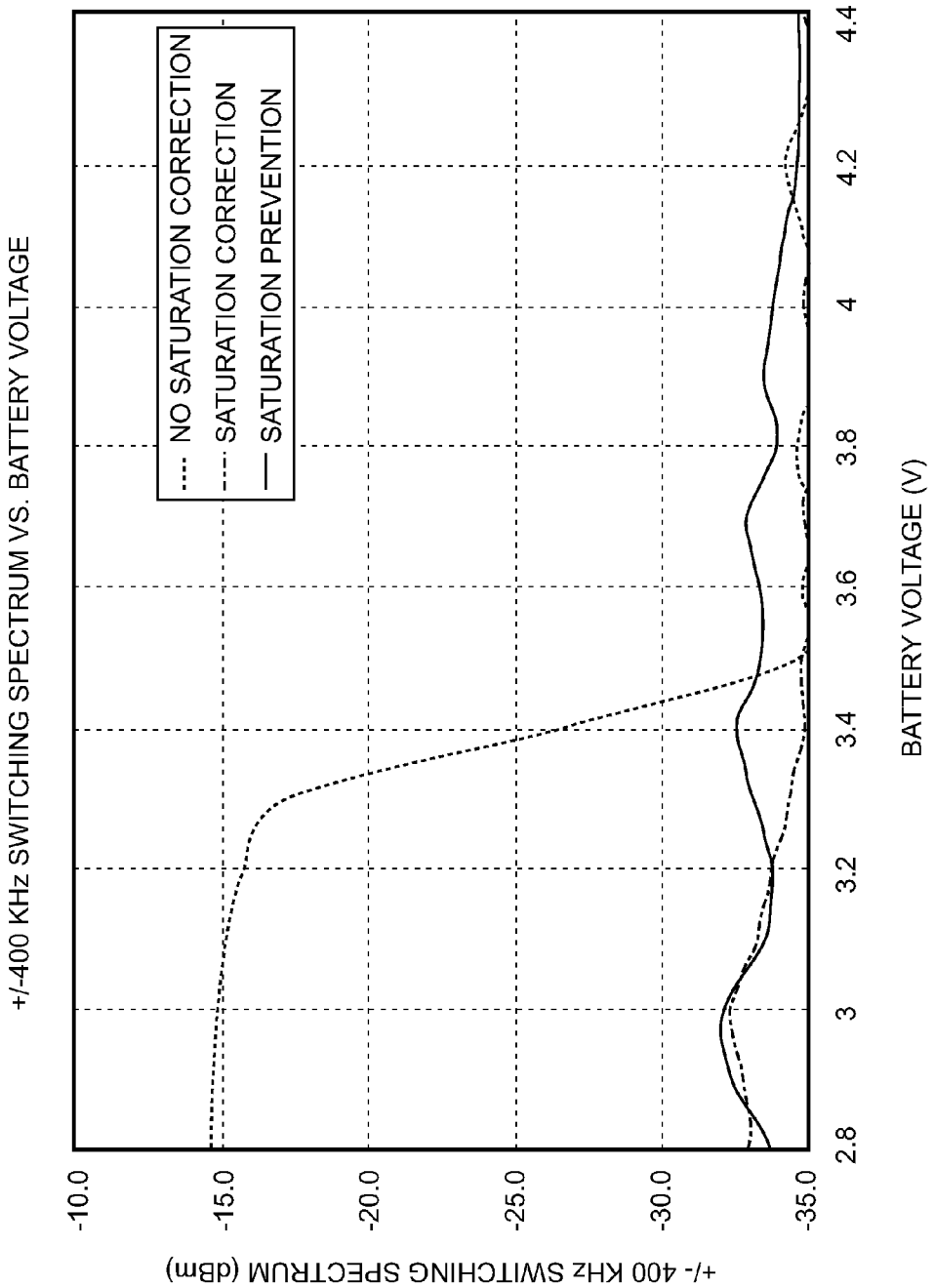
FIG. 13 is a graph of +/−400 kHz switching spectrum versus battery voltage.

FIG. 13 is a graph of a +/−400 kHz switching spectrum versus battery voltage. This graph illustrates the value of the disclosed saturation correction and saturation prevention methods. Notice that when a battery supply voltage drops below a certain point, and in this case to around 3.5V, the +/−400 kHz switching spectrum increases to an undesirable level that is greater than −20 dBm. In contrast, both the saturation correction method and the saturation prevention method maintain a desirable +/−400 kHz switching spectrum that is below −30 dBm for all battery voltage levels.

Those skilled in the art will recognize improvements and modifications to the present disclosure. All such improvements and modifications are considered within the scope of the concepts disclosed herein.

What is claimed is:

1. A closed loop power amplifier (PA) control system comprising:
    power amplifier circuitry adapted to amplify a radio frequency (RF) signal; and
    power control circuitry adapted to provide an adjustable power control signal for controlling an output power of the power amplifier circuitry, wherein the power control circuitry is further adapted to adjust the adjustable power control signal in response to a feedback signal from the power amplifier circuitry and in response to a dynamic baseband signal having an amplitude for urging an increase in the output power of the power amplifier circuitry before the beginning of a transmission of the RF signal and for urging a decrease in the output power after the transmission of the RF signal and in response to a fixed dc signal having a voltage that urges a constant output power in place of the dynamic baseband signal during the transmission of the RF signal, wherein the fixed dc signal is derived from a sample voltage of the feedback signal by subtracting a correction offset voltage derived from the sample voltage that is taken at a predetermined time that is referenced to the dynamic baseband signal.

2. The closed loop PA control system of claim 1, wherein the power amplifier circuitry is further adapted to replace the fixed dc signal with the dynamic baseband signal in response to a decrease in the amplitude of the dynamic baseband signal.

3. The closed loop PA control system of claim 1, wherein the output power delivered by the power amplifier circuitry is decreased by a fraction of a decibel (dB) while the fixed dc signal is urging a constant output power from the power amplifier circuitry.

4. The closed loop PA control system of claim 2, wherein the sample of the feedback signal is a dc voltage and the fixed dc signal is a dc voltage signal that is slightly less than the dc voltage of the sample of the feedback signal.

5. A mobile terminal comprising:
a control system providing a dynamic baseband signal and a baseband data signal to control output power for transmitted radio frequency (RF) signals; and
communications electronics associated with the control system and comprising:
power amplifier circuitry adapted to amplify an RF signal; and
power control circuitry adapted to provide an adjustable power control signal for controlling an output power of the power amplifier circuitry, wherein the power control circuitry is further adapted to adjust the adjustable power control signal in response to a feedback signal from the power amplifier circuitry, and in response to the dynamic baseband signal having an amplitude for urging an increase in the output power of the power amplifier circuitry before the beginning of a transmission of the RF signal, and for urging a decrease in the output power after the transmission of the RF signal and in response to a fixed dc signal having a voltage that urges a constant output power in place of the dynamic baseband signal during the transmission of the RF signal, wherein the fixed dc signal is derived from a sample voltage of the feedback signal by subtracting a correction offset voltage derived from the sample voltage that is taken at a predetermined time that is referenced to the dynamic baseband signal.

6. The mobile terminal of claim 5, wherein the power amplifier circuitry is further adapted to replace the fixed dc signal with the dynamic baseband signal in response to a decrease in the amplitude of the dynamic baseband signal.

7. The mobile terminal of claim 5, wherein output power delivered by the power amplifier circuitry is decreased by a fraction of a decibel (dB) while the fixed dc signal is urging a constant output power from the power amplifier circuitry.

8. The mobile terminal of claim 6, wherein the sample of the feedback signal is a dc voltage and the fixed dc signal is a dc voltage signal that is slightly less than the dc voltage of the sample of the feedback signal.

9. A closed loop power amplifier (PA) control system comprising:
power amplifier circuitry adapted to amplify a radio frequency (RF) signal; and
power control circuitry adapted to provide an adjustable power control signal for controlling an output power of the power amplifier circuitry, wherein the power control circuitry is further adapted to adjust the adjustable power control signal in response to a feedback signal from the power amplifier circuitry, and in response to a dynamic baseband signal having an amplitude for urging an increase in the output power of the power amplifier circuitry before the beginning of a transmission of the RF signal, for urging a decrease in the output power after the transmission of the RF signal, and for urging a fixed output power during transmission of the RF signal in response to a fixed dc signal derived from a sample voltage of the feedback signal, wherein the power control circuitry is further adapted to automatically subtract a correction offset voltage from the fixed dc signal to reduce the fixed output power by a predetermined amount of offset power for power levels above a given power level during the transmission of the RF signal and for maintaining the fixed output power for power levels below the given power level during the transmission of the RF signal.

10. The closed loop PA control system of claim 9, wherein the power control circuitry is further adapted to receive a baseband data signal signifying a power level at which the power amplifier circuitry is to operate.

11. The closed loop PA control system of claim 9, wherein PA output power associated with the power levels above the given power level are calibrated to include the predetermined amount of offset power.

12. The closed loop power amplifier (PA) control system of claim 9, wherein the predetermined amount of offset power is a fraction of a decibel (dB) for the power levels above the given power level during the transmission of the RF signal.

13. A mobile terminal comprising:
a control system providing a dynamic baseband signal to control output power for transmitted radio frequency (RF) signals and providing a baseband data signal indicative of a power level at which the mobile terminal is to operate; and
communications electronics associated with the control system and comprising:
power amplifier circuitry adapted to amplify an RF signal; and
power control circuitry adapted to provide an adjustable power control signal for controlling an output power of the power amplifier circuitry, wherein the power control circuitry is further adapted to adjust the adjustable power control signal in response to a feedback signal from the power amplifier circuitry and in response to the dynamic baseband signal having an amplitude for urging an increase in the output power of the power amplifier circuitry before the beginning of a transmission of the RF signal, for urging a decrease in the output power after the transmission of the RF signal, and for urging a fixed output power during transmission of the RF signal in response to a fixed dc signal derived from a sample voltage of the feedback signal, wherein the power control circuitry is further adapted to automatically subtract a correction offset voltage from the fixed dc signal to reduce the fixed output power by a predetermined amount of offset power for power levels above a given power level during the transmission of the RF signal and for maintaining the fixed output power for power levels below the given power level during transmission of the RF signal.

14. The mobile terminal of claim 13, wherein the power control circuitry is further adapted to receive the baseband data signal indicative of a power level at which the power amplifier circuitry is to operate.

15. The mobile terminal of claim 13, wherein PA output power associated with the power levels above the given power level are calibrated to include the predetermined amount of offset power.

16. The mobile terminal of claim 13, wherein the predetermined amount of offset power is a fraction of a decibel (dB) for the power levels above the given power level during the transmission of the RF signal.

17. A method comprising:
providing a power amplifier circuitry to amplify a radio frequency (RF) signal, the power amplifier circuitry being responsive to an adjustable power control signal that dictates an amount of output power delivered by the power amplifier circuitry;

providing a power control circuitry that is responsive to a dynamic baseband signal having an amplitude for urging an increase in the amount of output power delivered by the power amplifier circuitry before the beginning of a transmission of the RF signal, for urging a decrease in the amount of output power after the transmission of the RF signal, and for urging a fixed output power during the transmission of the RF signal in response to a fixed dc signal that is derived from a sample voltage of a feedback signal, the power control circuitry being further responsive to a baseband data signal that is indicative of a power level at which the power amplifier circuitry is to operate; and generating the adjustable power control signal in response to both the dynamic baseband signal and the baseband data signal such that the fixed output power is reduced by a predetermined amount of offset power by subtracting from the fixed dc signal a fixed correction offset voltage corresponding to the baseband data signal for power levels above a given power level during the transmission of the RF signal and for maintaining the fixed output power for power levels below the given power level during the transmission of the RF signal.

18. The method of claim 17, wherein the amount of output power delivered by the power amplifier circuitry that corresponds to the power levels above the given power level is calibrated to include the predetermined amount of offset power.

19. The method of claim 17, wherein the amount of output power delivered by the power amplifier circuitry that corresponds to the power levels above the given power level is calibrated to include the predetermined amount of offset power.

20. The method of claim 17, wherein the predetermined amount of offset power is a fraction of a decibel (dB) for power levels above the given power level during the transmission of the RF signal.

* * * * *